United States Patent
Toku et al.

(10) Patent No.: US 12,008,072 B2
(45) Date of Patent: Jun. 11, 2024

(54) CONTROL SYSTEM AND CONTROL METHOD

(71) Applicant: OMRON Corporation, Kyoto (JP)

(72) Inventors: Takahiro Toku, Kusatsu (JP); Kota Miyamoto, Ritto (JP)

(73) Assignee: OMRON Corporation, Kyoto (JP)

( * ) Notice: Subject to any disclaimer, the term of this patent is extended or adjusted under 35 U.S.C. 154(b) by 731 days.

(21) Appl. No.: 17/278,664

(22) PCT Filed: Oct. 9, 2019

(86) PCT No.: PCT/JP2019/039737
§ 371 (c)(1),
(2) Date: Mar. 23, 2021

(87) PCT Pub. No.: WO2020/085084
PCT Pub. Date: Apr. 30, 2020

(65) Prior Publication Data
US 2022/0044060 A1    Feb. 10, 2022

(30) Foreign Application Priority Data

Oct. 23, 2018  (JP) ................................ 2018-198963

(51) Int. Cl.
*G06F 18/2113* (2023.01)
*G05B 23/02* (2006.01)
(Continued)

(52) U.S. Cl.
CPC ...... *G06F 18/2113* (2023.01); *G05B 23/0221* (2013.01); *G05B 23/024* (2013.01);
(Continued)

(58) Field of Classification Search
CPC .. G06F 18/2113; G06F 18/213; G06F 18/214; G06F 18/2431; G05B 23/0221;
(Continued)

(56) References Cited

U.S. PATENT DOCUMENTS

| | | | |
|---|---|---|---|
| 2018/0275631 A1 | 9/2018 | Kitamura et al. | |
| 2019/0082276 A1* | 3/2019 | Crow | H04R 25/505 |

FOREIGN PATENT DOCUMENTS

| | | |
|---|---|---|
| CN | 101484910 | 7/2009 |
| CN | 106797463 | 5/2017 |

(Continued)

OTHER PUBLICATIONS

"Search Report of Europe Counterpart Application", dated Jun. 29, 2022, p. 1-p. 14.
(Continued)

*Primary Examiner* — Shane D Woolwine
(74) *Attorney, Agent, or Firm* — JCIPRNET

(57) ABSTRACT

A control system includes: a generation unit that generates a dataset for each unit section; a feature extraction unit that generates feature quantity data on the basis of the dataset; and a score calculation unit that calculates a score indicating a degree of deviation of the feature quantity data from learning data, by referring to the learning data. The feature quantity data and the score are output as compression results of the dataset. The control system includes a restoration unit that selects pattern data corresponding to a class determined according to the score contained in the compression result, and after adjusting the pattern data using the feature quantity data contained in the compression results, restores the pattern data as a temporal change in the dataset corresponding to the compression results.

10 Claims, 16 Drawing Sheets

(51) Int. Cl.
*G06F 18/213* (2023.01)
*G06F 18/214* (2023.01)
*G06F 18/2431* (2023.01)
*G06N 20/00* (2019.01)
*H03M 7/30* (2006.01)

(52) U.S. Cl.
CPC .......... *G06F 18/213* (2023.01); *G06F 18/214* (2023.01); *G06F 18/2431* (2023.01); *G06N 20/00* (2019.01); *H03M 7/6041* (2013.01); *H03M 7/3059* (2013.01)

(58) Field of Classification Search
CPC ...... G05B 23/024; G06N 20/00; G06N 20/10; G06N 20/20; H03M 7/6041; H03M 7/3059
See application file for complete search history.

(56) References Cited

FOREIGN PATENT DOCUMENTS

| CN | 108227641 | 6/2018 |
|---|---|---|
| EP | 3336638 | 6/2018 |
| EP | 3379360 | 9/2018 |
| JP | H0589009 | 4/1993 |
| JP | H06113580 | 4/1994 |
| JP | H06237909 | 8/1994 |
| JP | 2011221799 | 11/2011 |
| JP | 2012165357 | 8/2012 |
| JP | 2017062713 | 3/2017 |
| WO | 2016068895 | 5/2016 |
| WO | 2018167900 | 9/2018 |

OTHER PUBLICATIONS

Jinwon An et al., "Variational Autoencoder based Anomaly Detection using Reconstruction Probability," retrieved from the Internet: http://dm.snu.ac.kr/static/docs/TR/SNUDM-TR-2015-03.pdf, Dec. 2015, pp. 1-18.

Anonymous, "Autoencoder," wikipedia, retrieved from the Internet: https://en.wikipedia.org/w/index.php?title=Autoencoder&oldid=860088092, Sep. 2018, pp. 1-6.

"International Search Report (Form PCT/ISA/210) of PCT/JP2019/039737," dated Dec. 3, 2019, with English translation thereof, pp. 1-2.

"Written Opinion of the International Searching Authority (Form PCT/ISA/237) of PCT/JP2019/039737," dated Dec. 3, 2019, with English translation thereof, pp. 1-6.

Qiu-Shi Zhang et al., "Application Research on Distributed Control System Database", Computer Simulation, Nov. 2013, with English abstract, pp. 104-107, vol. 30, No. 11.

"Office Action of China Counterpart Application", dated Dec. 15, 2023, with English translation thereof, pp. 1-19.

* cited by examiner

CONTROL SYSTEM AND CONTROL METHOD

CROSS-REFERENCE TO RELATED APPLICATION

This application is a 371 application of the International PCT application serial no. PCT/JP2019/039737, filed on Oct. 9, 2019, which claims the priority benefit of Japan Patent Application No. 2018-198963, filed on Oct. 23, 2018. The entirety of each of the above-mentioned patent applications is hereby incorporated by reference herein and made a part of this specification.

BACKGROUND

Technical Field

The present invention relates to a control system and a control method that can store a temporal change in an input value.

Related Art

At various production sites, there is a need for detecting abnormalities that occur in a machine, an apparatus, or the like at an early stage to improve a facility operation rate. In a typical abnormality monitoring method, data is collected from a machine or an apparatus, and whether or not any abnormality has occurred is determined on the basis of the collected data.

On the other hand, no abnormality may have actually occurred even if it is determined that some abnormality has occurred. Therefore, in addition to a monitoring result, the data collected from the machine or the apparatus (hereinafter, also referred to as "raw data") is often required to be preserved. This preserved raw data can be used for tuning algorithms, threshold values, and the like of the abnormality monitoring by analyzing the preserved raw data.

In general, long-term raw data storage requires a large storage area. Therefore, there is a need for reducing storage area as much as possible.

For example, Japanese patent Laid-Open No. 05-089009 (Patent literature 1) discloses a network controller that transmits and receives compressed data. The network controller disclosed in Patent literature 1 includes a register in which data to be compressed or not is set, and employs a configuration in which raw data or a data processed via a compression circuit is output to a transceiver by referring to contents set in the register at the time of transmission, and data received via a receiver is fetched inside as the raw data or via a restoration circuit according to contents decoded by a judgment logic at the time of reception.

In addition, International Publication No. WO 2016/068895 (Patent literature 2) discloses a method of compressing raw data while selecting a compression algorithm and adjusting parameters on the basis of contextual knowledge.

LITERATURE OF RELATED ART

Patent Literature

Patent literature 1: Japanese Patent Laid-Open No. 05-089009
Patent literature 2: International Publication No. WO2016/068895

SUMMARY

In general, it is necessary to allocate resources to the abnormality monitoring processing, and additional processing for data compression as disclosed in Patent literature 1 and Patent literature 2 may not be executed. Therefore, in addition to the abnormality monitoring processing, there is a demand for a configuration that can realize storage of raw data more efficiently.

A control system according to an example of the present invention includes a generation unit that generates a dataset including temporal changes in one or more input values for each unit section, a feature extraction unit that generates feature quantity data on the basis of the dataset, and a score calculation unit that calculates a score indicating a degree of deviation of the feature quantity data from learning data, by referring to the learning data including feature quantity data labeled with a specific class. The feature quantity data and score are output as compression results of the dataset. The control system includes a restoration unit that selects pattern data corresponding to a class determined according to the score contained in the compression results by referring to pattern data for each class prepared in advance, and after adjusting the pattern data using the feature quantity data contained in the compression results, restores the pattern data as a temporal change in the dataset corresponding to the compression results.

According to this configuration, the control system can significantly reduce required storage area by outputting the feature quantity data and the score which are also used for abnormality monitoring as the compression results of the dataset, as compared with a case in which the dataset including temporal changes in one or more input values is stored directly. In addition, data restoration processing can be simplified by selecting pattern data corresponding to the class determined according to the score contained in the compression result, and after adjusting the pattern data using the feature quantity data contained in the compression results, restoring the pattern data as a temporal change in the dataset corresponding to the compression results.

In the above configuration, a plurality of the compression results may be continuously output, and the restoration unit may continuously restore the temporal change in the dataset from each of the compression results.

According to this configuration, even temporal changes over a plurality of unit sections can be appropriately compressed and restored.

In the above configuration, the feature quantity data includes an average and a standard deviation of the dataset, and the restoration unit may restore the temporal change in the dataset by denormalizing corresponding pattern data on the basis of the average and the standard deviation of the dataset.

According to this configuration, highly reproducible data restoration can be accomplished by using the average and the standard deviation.

In the above configuration, the control system further includes a sampling unit that extracts a temporal change in a dataset corresponding to a compression result when the score included in the compression result exceeds a predetermined value.

According to this configuration, the reproducibility of the restored temporal change can be improved by adding a new pattern data even when a temporal change different from the pattern data for each class prepared in advance occurs.

In the above configuration, when the degree of deviation of the temporal change in the extracted dataset from the pattern data prepared in advance exceeds a predetermined value, the sampling unit adds the temporal change in the extracted dataset as the pattern data referred to by the restoration unit.

According to this configuration, among the pattern data extracted by the sampling unit, only the pattern data different from the pattern data prepared in advance is newly added, and thus the efficiency in the storage area and processing can be improved.

In the above configuration, in addition to the feature quantity data and the score, the pattern data added by the sampling unit is also output as the compression result.

According to this configuration, the added pattern data can be referred to in the restoration unit, and therefore the reproducibility can be improved even when a temporal change different from the pattern data prepared in advance occurs.

In the above configuration, the restoration unit restores the temporal change in the dataset by referring to the pattern data added by the sampling unit in addition to the pattern data prepared in advance.

According to this configuration, the restoration unit refers to the pattern data added by the sampling unit in addition to the pattern data prepared in advance, and therefore the reproducibility can be improved.

In the above configuration, the control system further includes a judgment unit that judges, on the basis of the score, whether or not an abnormality has occurred in an object to be monitored related to one or more input values.

According to this configuration, in addition to the storage processing and restoration processing of the dataset including temporal changes in one or more input values, monitoring of the presence or absence of an abnormality in the object to be monitored can also be accomplished by using the same information.

In the above configuration, the control apparatus system includes a control apparatus that controls an object to be controlled and external apparatuses capable of communicating with the control apparatus. The generation unit, the feature extraction unit, and the score calculation unit may be arranged in the control apparatus, and the restoration unit may be arranged in the external apparatus.

According to this configuration, the storage processing of the dataset including the temporal changes in one or more input values can be executed in the control apparatus, and also, the compression/restoration processing of the raw dataset can be restored in the external apparatus.

According to another example of the present invention, there is provided a control method executed in a control system including a control apparatus for controlling an object to be controlled. The control method includes: a step of generating a dataset including temporal changes in one or more input values for each unit section; a step of generating feature quantity data on the basis of the dataset; and a step of calculating a score indicating a degree of deviation of the feature quantity data from learning data, by referring to the learning data including feature quantity data labeled with a specific class. The feature quantity data and the score are output as compression results of the dataset. The control method includes a step of selecting pattern data corresponding to the class determined according to the score contained in the compression result by referring to pattern data for each class prepared in advance, and after adjusting the pattern data using the feature quantity data contained in the compression results, restoring the pattern data as a temporal change in the dataset corresponding to the compression results.

According to this configuration, the control system can significantly reduce required storage area by outputting the feature quantity data and the score which are also used for abnormality monitoring as the compression results of the dataset, as compared with a case in which the dataset including temporal changes in one or more input values is stored directly. In addition, data restoration processing can be simplified by selecting pattern data corresponding to the class determined according to the score contained in the compression result, and after adjusting the pattern data using the feature quantity data contained in the compression results, restoring the pattern data as a temporal change in the dataset corresponding to the compression results.

According to the present invention, it is possible to realize a configuration in which raw data storage can be accomplished more efficiently in addition to the abnormality monitoring processing.

DESCRIPTION OF THE EMBODIMENTS

Figure 1:
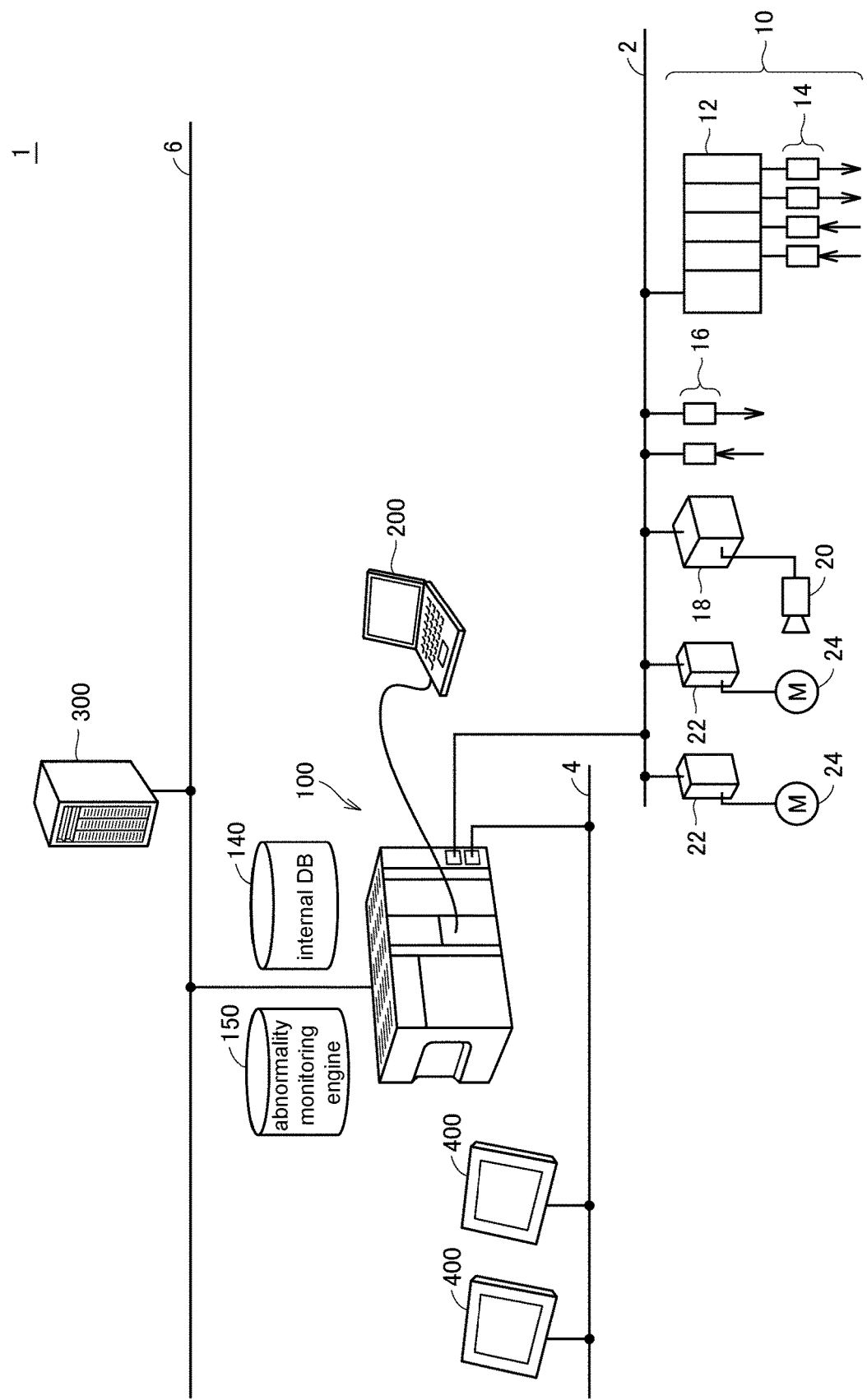
FIG. 1 is a schematic diagram showing an overall configuration example of an abnormality monitoring system according to the embodiment.

An embodiment of the present invention is described in detail with reference to the drawings. Moreover, the same or corresponding parts in the drawings are designated by the same reference signs and the description thereof is not repeated.

A. APPLICATION EXAMPLE

First, an example of a situation in which the present invention is applied is described.

A functional configuration example of a control system capable of executing abnormality monitoring processing according to the embodiment is described. In the following description, the description mainly focuses on the abnormality monitoring processing provided by the control system, and therefore the entire control system is also referred to as an "abnormality monitoring system".

First, an overall configuration example of an abnormality monitoring system 1 according to the embodiment is described.

FIG. 1 is a schematic diagram showing the overall configuration example of the abnormality monitoring system 1 according to the embodiment. With reference to FIG. 1, the abnormality monitoring system 1 includes, as main components, a control apparatus 100 that controls an object to be controlled and a support apparatus 200 that can be connected to the control apparatus 100. The abnormality monitoring system 1 may further include, as an optional configuration, a high-order server 300 and a display apparatus 400 (HMI: Human Machine Interface; hereinafter also referred to as "HMI").

The control apparatus 100 generates a judgment result indicating whether or not any abnormality has occurred in an object to be monitored contained in the object to be controlled. The control apparatus 100 may be embodied as a type of computer such as a programmable controller (PLC) or the like.

More specifically, the control apparatus 100 is connected to a field apparatus group 10 via a first fieldbus 2, and is connected to one or more HMIs 400 via a second fieldbus 4. Furthermore, the control apparatus 100 is connected to the high-order server 300 via a local network 6. The control apparatus 100 exchanges data with the connected apparatus via respective networks.

The control apparatus 100 has a control calculation execution engine that executes various calculations for controlling an equipment or a machine. In addition to the control calculation execution engine, the control apparatus 100 has an acquisition function for acquiring data acquired by the field apparatus group 10 and transferred to the control apparatus 100 (hereinafter, also referred to as "input data"). Besides, the control apparatus 100 also has an abnormality monitoring function for monitoring whether or not an abnormality has occurred in the object to be controlled on the basis of the acquired input data or the like. By implementing these functions in the control apparatus 100, the abnormality generated in the object to be controlled can be monitored in a shorter cycle.

As for the above abnormality monitoring function, an abnormality monitoring engine 150 mounted in the control apparatus 100 provides a monitoring function, and an internal database 140 (hereinafter, also referred to as "internal DB") implemented in the control apparatus 100 provides various data storage functions. Details of the internal DB 140 and the abnormality monitoring engine 150 is described later.

As the first fieldbus 2 and the second fieldbus 4, it is preferable to employ a network that performs fixed-cycle communication to ensure arrival time of data. EtherCAT (registered trademark) or the like is known as a network that performs the fixed-cycle communication.

The field apparatus group 10 includes an apparatus that collects state values of an object to be controlled, a manufacturing apparatus or a production line related to control, or the like (hereinafter, also collectively referred to as "field") as input data. An apparatus for acquiring the state values described above includes an input relay, various sensors, and the like. The field apparatus group 10 further includes an apparatus that exerts some action on the field on the basis of a command value (hereinafter, also referred to as "output data") generated by the control apparatus 100. An apparatus that exerts some action on the field includes an output relay, a contactor, a servo driver, a servo motor, and any other actuator. These field apparatus groups 10 exchange data including input data and the output data with the control apparatus 100 via the first fieldbus 2.

In the configuration example shown in FIG. 1, the field apparatus group 10 includes a remote I/O (Input/Output) apparatus 12, a relay group 14, an image sensor 18, a camera 20, a servo driver 22, and a servo motor 24.

The remote I/O apparatus 12 includes a communication unit that performs communication via the first fieldbus 2, and an input/output unit (hereinafter, also referred to as an "I/O unit") for acquiring the input data and outputting the output data. The input data and the output data are exchanged between the control apparatus 100 and the field via the I/O unit. FIG. 1 shows an example in which digital signals are exchanged as the input data and the output data via the relay group 14.

The I/O unit may be directly connected to the fieldbus. FIG. 1 shows an example in which an I/O unit 16 is directly connected to the first fieldbus 2.

The image sensor 18 performs image measurement processing such as pattern matching or the like on the image data captured by the camera 20, and transmittings the processing result to the control apparatus 100.

The servo driver 22 drives the servomotor 24 according to the data (for example, a position command or the like) output from the control apparatus 100.

As described above, data is exchanged between the control apparatus 100 and the field apparatus group 10 via the first fieldbus 2, and these exchanged data are updated in a very short cycle of hundreds of microsecond order to tens of millisecond order. Moreover, the update processing of the exchanged data is also referred to as I/O refresh processing.

The support apparatus 200 is an apparatus that supports preparations necessary for the control apparatus 100 to control the object to be controlled. Specifically, the support apparatus 200 provides a development environment for a program executed by the control apparatus 100 (a program creating/editing tool, a parser, a compiler, or the like); a setting environment for setting parameters (configuration) of the control apparatus 100 and various devices connected to the control apparatus 100; a function of transmitting a generated user program to the control apparatus 100; a function of modifying/changing the user program or the like executed on the control apparatus 100 online; and the like. Furthermore, the support apparatus 200 also provides a function of setting a parameter and learning data that define the abnormality monitoring processing executed by the abnormality monitoring engine 150 mounted in the control apparatus 100.

The high-order server 300 is connected to the control apparatus 100 via the local network 6, and exchanges necessary data with the control apparatus 100. The high-order server 300 has, for example, a database function, and periodically or eventually collects data stored in the internal DB 140 of the control apparatus 100. A general-purpose protocol such as Ethernet (registered trademark) or the like may be implemented in the local network 6.

The HMI 400 is connected to the control apparatus 100 via the second fieldbus 4, receives an operation from a user, transmits a command or the like according to the user operation to the control apparatus 100, and graphically displays processing results and the like in the control apparatus 100.

Next, the abnormality monitoring processing according to the embodiment is described.

Figure 2:
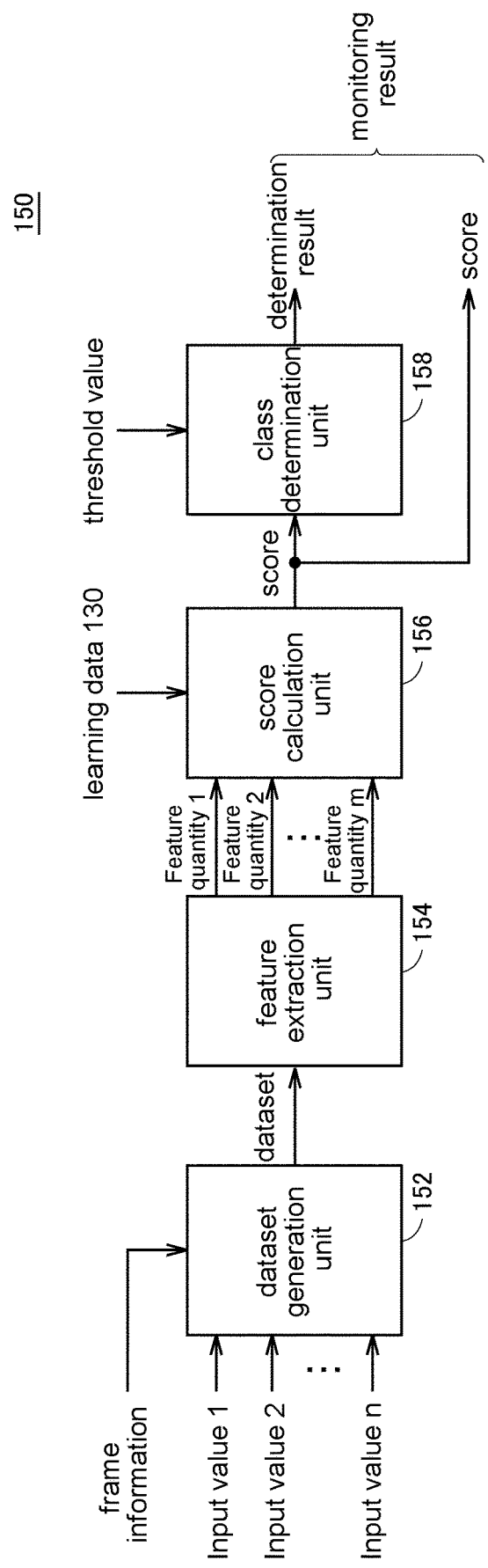
FIG. 2 is a functional block diagram for realizing abnormality monitoring processing in the abnormality monitoring system according to the embodiment.

FIG. 2 is a functional block diagram for realizing the abnormality monitoring processing in the abnormality monitoring system 1 according to the embodiment. With reference to FIG. 2, the abnormality monitoring engine 150 of the control apparatus 100 acquires one or more input values (Input value 1, Input value 2, . . . , Input value n) from the object to be controlled, and generates a feature quantity, or the like, thereby outputting a monitoring result including the presence or absence of an abnormality.

In the embodiment, a concept of "frame" is introduced as a unit section for judging whether or not any abnormality has occurred in the object to be monitored included in the object to be controlled. The frame means a unit section for judging whether or not any abnormality has occurred in the object to be monitored. Therefore, the judgment of whether or not any abnormality has occurred in the object to be monitored is performed for each frame.

More specifically, the abnormality monitoring engine 150 includes, as a main functional configuration, a dataset generation unit 152, a feature extraction unit 154, a score calculation unit 156, and a class decision unit 158.

The dataset generation unit 152 corresponds to the generation unit, and generates, from the object to be controlled, a dataset including temporal changes in one or more input values (input value 1, input value 2, . . . , input value n) for each frame according to a frame information.

The feature extraction unit 154 generates, on the basis of the dataset generated by the dataset generation unit 152, feature quantity data including one or more feature quantities (Feature quantity 1, Feature quantity 2, . . . , Feature quantity m) according to a predetermined processing. For example, an average, a maximum value, an intermediate value, a minimum value, a standard deviation, or the like in the frame can be used as the feature quantity.

The score calculation unit 156 calculates a value (hereinafter, also referred to as "score") indicating a degree of deviation of the feature quantity data (one or more feature quantities) generated by the feature extraction unit 154 from a learning data 130 by referring to the learning data 130 prepared in advance. Here, the learning data 130 includes feature quantity data labeled with a specific class (for example, normal or abnormal). Typically, the learning data 130 includes feature quantity data in a normal state, and in this case, the score means a value indicating a possibility that some abnormality is occurred in the object to be monitored.

As an example of the abnormality monitoring algorithm in the abnormality monitoring engine 150, a method of calculating a score corresponding to a feature quantity data on the basis of the degree of deviation of the feature quantity data from a normal value group in a hyperspace is employed. In this case, the learning data 130 indicates the normal value group in the hyperspace, and corresponds to a "model" indicating an object to be monitored.

As an abnormality monitoring method on the basis of the degree of deviation, a method of detecting abnormality on the basis of the shortest distance from each point to the normal value group (k-nearest neighbor algorithm), a local outlier factor (LoF) method of evaluating a distance including a cluster including the normal value group, an isolation forest (iForest) method using a score calculated from a path length, and the like are known.

When the abnormality monitoring method on the basis of the degree of deviation is employed, the learning data 130 includes a feature quantity group obtained at normal times, and the abnormality monitoring engine 150 calculates a score being a value indicating a possibility that some abnormality is occurred in the object to be monitored on the basis of the degree of deviation of the feature quantity of a target from the feature quantity group included in the learning data 130.

The class decision unit 158 compares the score calculated by the score calculation unit 156 with a predetermined threshold value, and decides which class the calculated score belongs to. Typically, in the abnormality monitoring processing, it is decided whether the score is classified into a class in which no abnormality has occurred in the object to be monitored or a class in which some abnormality has occurred in the object to be monitored, on the basis of whether or not the calculated score is within a range defined by the threshold value. The class determined in this way is output as a judgment result.

That is, the class decision unit 158 operates as a judgment unit for judging, on the basis of the score, whether or not an abnormality has occurred in the object to be monitored related to one or more input values.

Moreover, the monitoring result of the abnormality monitoring processing according to the embodiment may include the score calculated by the score calculation unit 156 in addition to the judgment result indicating whether or not an abnormality has occurred in the object to be monitored.

With the above functional configuration, the abnormality monitoring processing according to the embodiment is accomplished.

Next, processing related to the compression and restoration of the raw data using the abnormality monitoring processing according to the embodiment is described.

In the embodiment, significant lossy compression of the raw data is achieved by utilizing a calculation result obtained by the abnormality monitoring engine 150. In addition, the compressed raw data can be restored by a specific calculation procedure. Thus, by using the restored raw data, various analyzes can be performed when it is judged that some abnormality has occurred.

Figure 3:
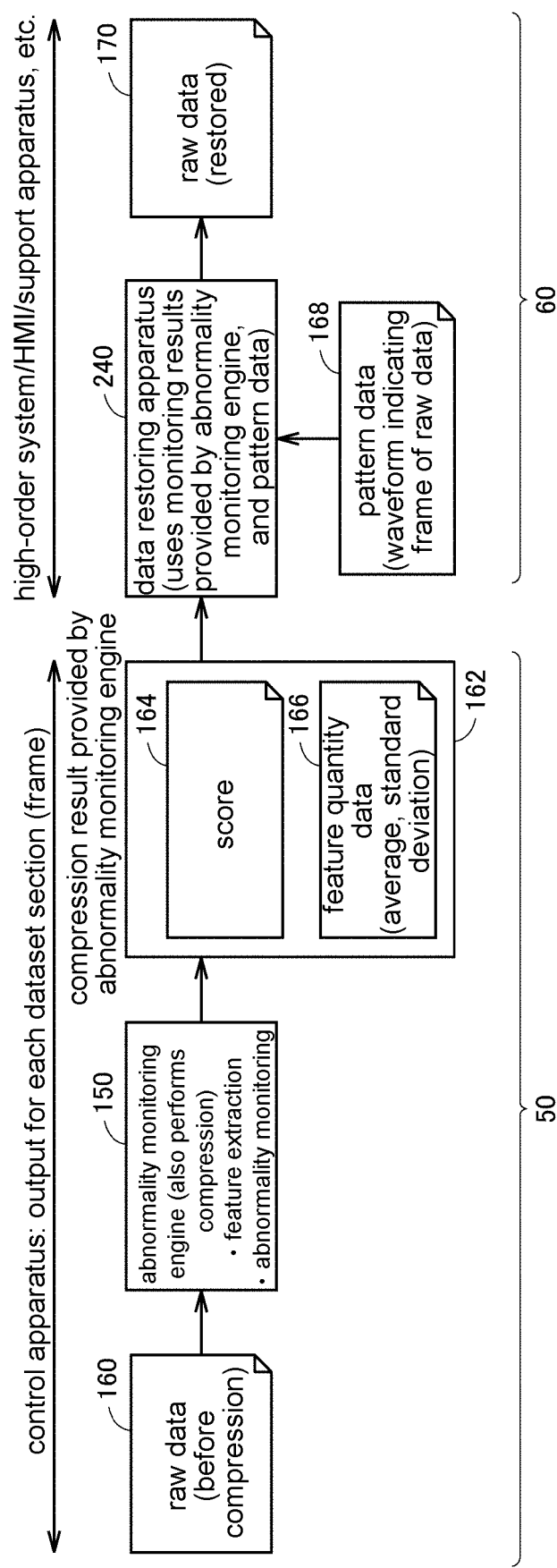
FIG. 3 is a schematic diagram showing a processing procedure related to compression and restoration of raw data in the abnormality monitoring system according to the embodiment.

FIG. 3 is a schematic diagram showing a processing procedure related to the compression and restoration of the raw data in the abnormality monitoring system 1 according to the embodiment. With reference to FIG. 3, the processing related to the compression and restoration of the raw data in the abnormality monitoring system 1 according to the embodiment has a data compression phase 50 and a data restoration phase 60.

The control apparatus 100 has the abnormality monitoring engine 150 (the dataset generation unit 152, the feature extraction unit 154, the score calculation unit 156, and the class decision unit 158). In the data compression phase 50, the control apparatus 100 outputs the compression result of the raw data input for each dataset section (frame). The abnormality monitoring engine 150 also serves to perform compression processing. In the compression processing, a compression result of the raw data is generated by using a compression result 162 which is obtained by feature extraction, abnormality monitoring, and the like, and corresponds to the monitoring result obtained by the abnormality monitoring engine 150.

The compression result 162 of a dataset (raw data 160) obtained by the abnormality monitoring engine 150 includes, for example, a score 164 being a value indicating a possibility that some abnormality has occurred in the object to be monitored, and a feature quantity data 166 such as the average, the standard deviation, or the like in a target frame. That is, the feature quantity data 166 and the score 164 are output as the compression result 162 of the dataset.

On the other hand, the high-order server 300, which is an example of external apparatuses, has a data restoring apparatus 240. In the data restoration phase 60, the data restoring apparatus 240 is used to restore the compression result 162 obtained from the abnormality monitoring engine 150 to a raw data 170. The restoration to the raw data 170 by the data restoring apparatus 240 is performed by referring to a pattern data 168. The pattern data 168 is a waveform corresponding to a frame of the raw data, and a plurality of types are prepared in advance.

The data restoring apparatus 240 restores to the raw data 170 by sequentially selecting and combining corresponding pattern data 168 on the basis of the compression result 162 obtained from the abnormality monitoring engine 150. In this way, the data restoring apparatus 240 utilizes the compression result 162 obtained by the abnormality monitoring engine 150 and the pattern data 168 for restoration.

In the abnormality monitoring system 1 according to the embodiment, the raw data can be compressed and restored by using the compression result 162 being also the monitoring result generated by the abnormality monitoring processing. Therefore, the abnormality monitoring processing and the raw data storage can be efficiently accomplished.

Figure 4:
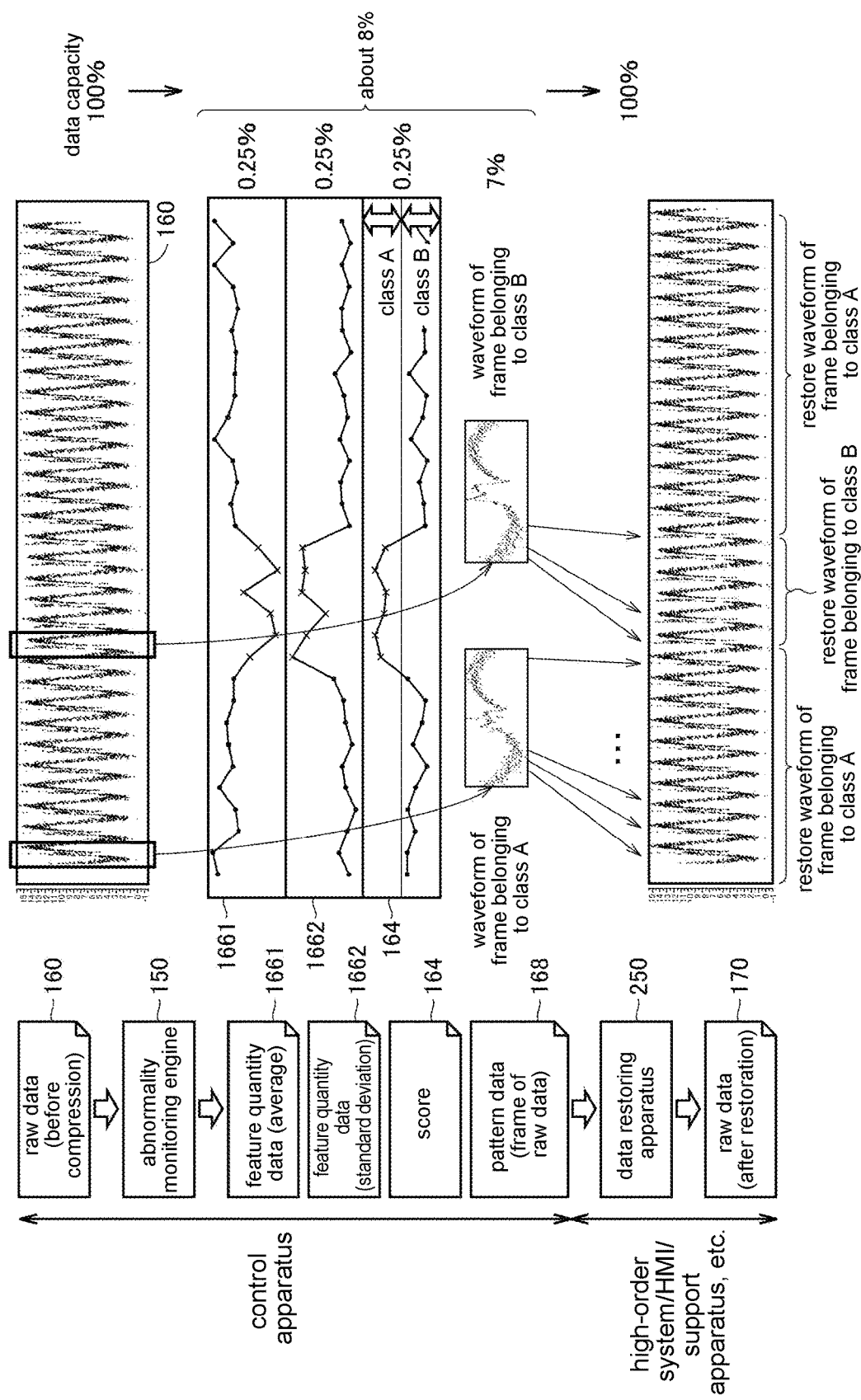
FIG. 4 is a schematic diagram showing an example of processing contents of processing related to the compression and restoration of the raw data shown in FIG. 3.

FIG. 4 is a schematic diagram showing an example of the processing contents of the processing related to compression and restoration of the raw data shown in FIG. 3. First, the raw data 160 as shown in FIG. 4 is assumed. A data capacity that can completely represent the waveform of the raw data 160 is set to 100%. The abnormality monitoring engine 150, which also functions as a data compressor, calculates the feature quantity data 166 from the raw data 160 and calculates the score 164 on the basis of the calculated feature quantity data 166. For example, the feature quantity data 166 includes a first feature quantity data 1661 indicating the average in each frame and a second feature quantity data 1662 indicating the standard deviation of each frame.

Furthermore, the abnormality monitoring engine 150 decides which class the score 164 calculated for each frame belongs to. In this example, there is a classification problem of two classes (class A and class B). Typically, the class A corresponds to a state in which some abnormality has occurred in the object to be monitored, and the class B corresponds to a state in which no abnormality has occurred in the object to be monitored.

The pattern data 168 is prepared in advance for each class. The example shown in FIG. 4 includes a waveform of a frame belonging to the class A and a waveform of a frame belonging to the class B.

In this way, information obtained by compressing the raw data 160 includes the feature quantity data 166 (the first feature quantity data 1661 and the second feature quantity data 1662), the score 164, and the pattern data 168.

On the other hand, in the data restoring apparatus 240, the compression result of the raw data 160 is restored to the original time waveform on the basis of the waveform (temporal change in the raw data) for each frame belonging to each classified class included in the pattern data 168. In the example shown in FIG. 4, the compression result of the raw data 160 is restored to the raw data 170 by selectively using either the waveform of the frame belonging to the class A or the waveform of the frame belonging to the class B according to the class classification for each frame included in the score 164.

As shown in FIG. 4, a plurality of compression results of the raw data 160 are continuously output, and the data restoring apparatus 240 continuously restores the temporal change in the dataset (the raw data 160) from each compression result.

For example, assuming a manufacturing apparatus as the object to be monitored, when the manufacturing apparatus is in a stable operation state, the same pattern waveform is repeated in a normal state, and a different pattern waveform appears in an abnormal state.

An example of the effect of data compression in the abnormality monitoring system 1 according to the embodiment can be calculated as follows.

For example, assuming that the I/O refresh processing is executed in a 250 μs cycle (sampling frequency is 4 kHz) and the input data used for the abnormality monitoring processing is 10 variables (each has 2 bytes), the data amount that must be stored is 4 kHz×10 variables×2 bytes=80 kbytes/sec.

In addition, assuming that the frame length in the abnormality monitoring processing is 100 msec (length of one dataset: monitoring frequency of 10 Hz) and the calculated quantities has two types, an average and a standard deviation for each variable (each has 2 bytes), the data amount of the generated feature quantity is 10 Hz×10 variables×2 types× bytes=40 bytes/sec. That is, the data amount can be compressed to about 0.5% of the raw data 160. In addition, the amount of the score 164 can also be compressed to about 0.25% of the raw data 160 by the same calculation. Besides, it can be estimated that the waveform belonging to each class included in the pattern data 168 is about 8% of the total data capacity of the raw data 160.

By combining compression ratios, the raw data 160 can be compressed to about 8% and stored by using the abnormality monitoring engine 150.

As described above, in the abnormality monitoring system 1 according to the embodiment, the raw data 160 can be significantly compressed by using the processing such as feature extraction, score calculation, class decision, or the like in the abnormality monitoring engine 150.

B. HARDWARE CONFIGURATION EXAMPLE OF EACH APPARATUS

Next, a hardware configuration example of the main apparatuses constituting the abnormality monitoring system 1 according to the embodiment is described.

(b1: Hardware Configuration Example of Control Apparatus 100)

Figure 5:
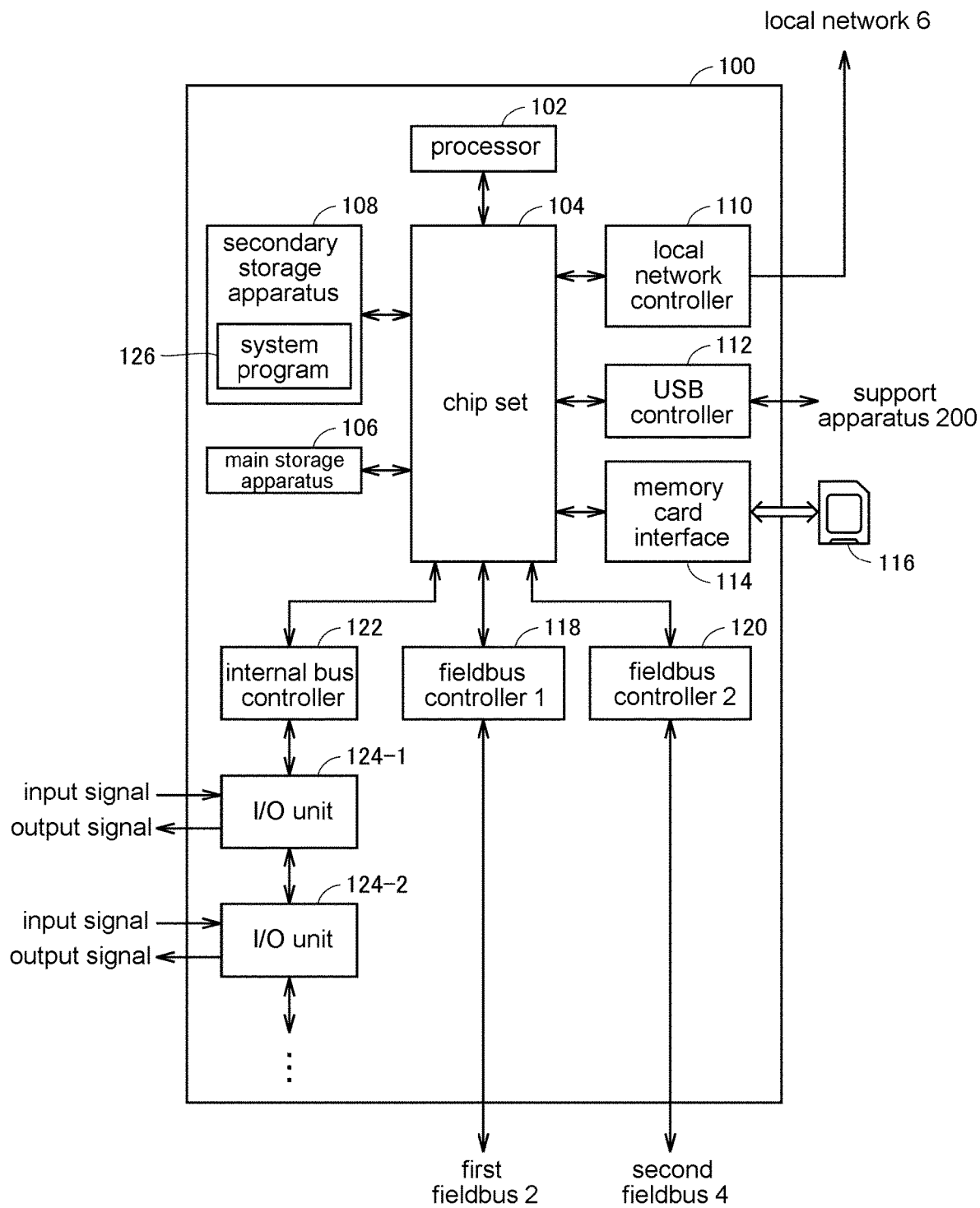
FIG. 5 is a block diagram showing a hardware configuration example of a control apparatus constituting the abnormality monitoring system according to the embodiment.

FIG. 5 is a block diagram showing a hardware configuration example of the control apparatus 100 configuring the abnormality monitoring system 1 according to the embodiment. With reference to FIG. 5, the control apparatus 100 includes: a processor 102 such as a central processing unit (CPU), a micro-processing unit (MPU), or the like; a chip set 104; a main storage apparatus 106; a secondary storage apparatus 108; a local network controller 110; a universal serial bus (USB) controller 112; a memory card interface 114; an internal bus controller 122; fieldbus controllers 118 and 120; and I/O units 124-1, 124-2 . . . .

The processor 102 realizes a control corresponding to the object to be controlled and various processes as described later by reading various programs stored in the secondary storage apparatus 108, deploying the programs in the main storage apparatus 106, and executing the deployed programs. The chip set 104, together with the processor 102, controls each component, thereby realizing processing of the overall control apparatus 100.

In the secondary storage apparatus 108, in addition to a system program 126 (corresponding to a control program) for realizing the function provided by the control apparatus 100, a user program executed using the execution environment provided by the system program 126 is stored. The system program 126 also stores a program for realizing the internal DB 140 and the abnormality monitoring engine 150.

The local network controller 110 controls data exchange with other apparatuses via the local network 6. A USB controller 112 controls data exchange with the support apparatus 200 via a USB connection.

The memory card interface 114 is configured to make a memory card 116 attachable and detachable, and can write data to the memory card 116 and read various data (user programs, trace data, and the like) from the memory card 116.

The internal bus controller 122 is an interface for exchanging data with the I/O units 124-1, 124-2 . . . mounted in the control apparatus 100.

The fieldbus controller 118 controls data exchange with other apparatuses via the first fieldbus 2. Similarly, the fieldbus controller 120 controls data exchange with other apparatuses via the second fieldbus 4.

FIG. 5 shows a configuration example in which necessary functions are provided by the processor 202 executing a program, and some or all of these provided functions may be implemented by using a dedicated hardware circuit (for example, an application specific integrated circuit (ASIC), a field-programmable gate array (FPGA), or the like). Alternatively, the main part of the control apparatus 100 may be accomplished by using hardware that follows a general-purpose architecture (for example, an industrial personal computer on the basis of a general-purpose personal computer). In this case, by using virtualization technology, a plurality of operating systems (OS) for different purposes may be executed in parallel and necessary applications may be executed on each OS.

(b2: Hardware Configuration Example of Support Apparatus 200)

Next, the support apparatus 200 according to the embodiment is accomplished, for example, by executing a program using hardware (for example, a general-purpose personal computer) that follows a general-purpose architecture.

Figure 6:
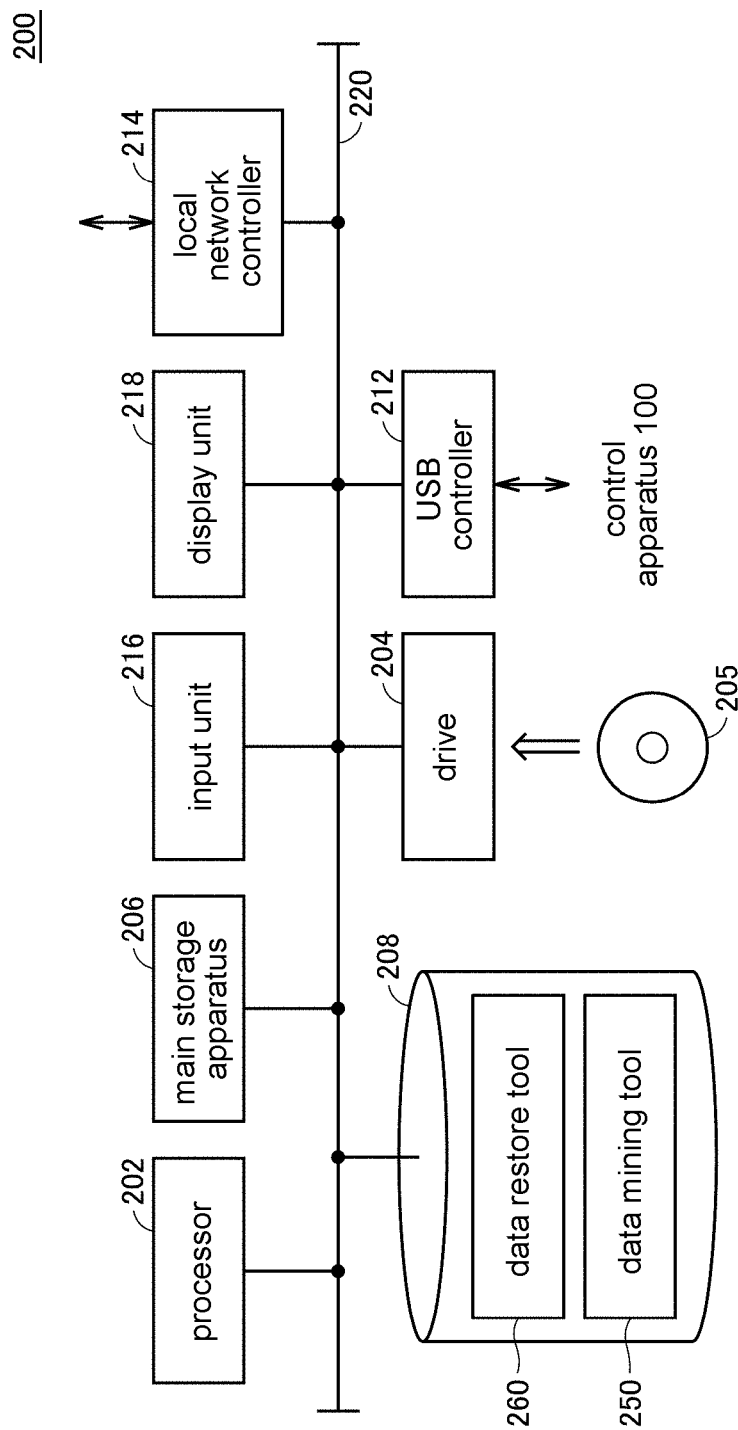
FIG. 6 is a block diagram showing a hardware configuration example of a support apparatus constituting the abnormality monitoring system according to the embodiment.

FIG. 6 is a block diagram showing a hardware configuration example of the support apparatus 200 constituting the abnormality monitoring system 1 according to the embodiment. With reference to FIG. 6, the support apparatus 200 includes a processor 202 such as a CPU, a MPU, or the like, a main storage apparatus 206, a secondary storage apparatus 208, a USB controller 212, a local network controller 214, an input unit 216 and a display unit 218. These components are connected via a bus 220.

The processor 202 realizes various processing as described later by reading various programs stored in the secondary storage apparatus 208, deploying the programs in the main storage apparatus 206 and executing the deployed programs.

The secondary storage apparatus 208 is constituted of, for example, a hard disk drive (HDD), a solid state drive (SSD), or the like. Typically, various programs including a development program (not shown) for creating a user program to be executed in the support apparatus 200, debugging the created program, defining a system configuration, setting various parameters, and the like, a data mining tool 250 and a data restore tool 260 are stored in the secondary storage apparatus 208. The OS and other necessary programs may also be stored in the secondary storage apparatus 208.

The drive 204 can write data to a storage medium 205 and read various data (user program, trace data, time series data, and the like) from the storage medium 205. The storage medium 205 includes, for example, a storage medium 205 (for example, an optical storage medium such as a digital versatile disc (DVD), or the like) that stores a computer-readable program non-transiently. A program or data stored in the memory card 116 or the storage medium 205 is read and installed in an internal storage area such as the secondary storage apparatus 208 or the like.

Various programs executed by the support apparatus 200 may be installed via the computer-readable memory card 116 or the storage medium 205, or may be installed by downloading from a server apparatus or the like on the network. In addition, the function provided by the support apparatus 200 according to the embodiment may be accomplished by using a part of modules provided by the OS.

The USB controller 212 controls data exchange with the control apparatus 100 via a USB connection. The local network controller 214 controls data exchange with other apparatuses via an arbitrary network.

The input unit 216 is constituted of a keyboard, a mouse, and the like, and receives an operation from a user. The display unit 218 is constituted of a display, various indicators, and the like, and outputs processing results and the like from the processor 202. A printer may be connected to the support apparatus 200.

FIG. 6 shows a configuration example in which necessary functions are provided by the processor 202 executing a program, and some or all of these provided functions may be implemented by using a dedicated hardware circuit (for example, ASIC, FPGA, or the like).

(b3: Hardware Configuration Example of High-Order Server 300)

The high-order server 300 according to the embodiment is accomplished, for example, by executing a program using hardware (for example, a general-purpose server) that follows a general-purpose architecture. Because the hardware configuration is the same as the hardware configuration of the support apparatus 200 shown in FIG. 6, the detailed description is not repeated.

(b4: Hardware Configuration Example of HMI 400)

The HMI 400 according to the embodiment is accomplished, for example, by executing a program using hardware that follows a general-purpose architecture (for example, an industrial personal computer on the basis of a general-purpose personal computer). Because the hardware configuration is the same as the hardware configuration of the support apparatus 200 shown in FIG. 6, the detailed description is not be repeated.

C. DATA COMPRESSION AND DATA RESTORATION

In the abnormality monitoring system 1 according to the embodiment, the compression performance is improved by preparing an optimum pattern data instead of selecting an optimum algorithm as disclosed in the Patent literature 2. In particular, when restoring raw data using the pattern data, by using the monitoring result (the compression result 162) of the abnormality monitoring processing, a dedicated processing related to the data compression and restoration can be eliminated, and the optimum pattern data can be selected.

This pattern data can be managed by the following method: (1) a method using a set of pattern data collected in advance (static management), and (2) a method of combining both a waveform of a sample section set at random and a waveform of a section in which an abnormality is likely to occur in the control apparatus 100 to obtain pattern data (dynamic management). By employing the dynamic management of (2), debugging performance in the case of an abnormality and data credibility of a data storage/restoration method using lossy compression can be improved effectively.

In the dynamic management, necessary information including the pattern data is transmitted from the control apparatus 100 to a processing entity (the high-order server 300, the HMI 400, the support apparatus 200, or the like) that restores data. The processing entity (the high-order server 300, the HMI 400, the support apparatus 200, or the like) corresponds to an external apparatus capable of communicating with the control apparatus 100. As a typical example, the necessary information including the pattern data is transmitted to the high-order server 300. For convenience of description, the description is given on the assumption that the necessary information including the pattern data is transmitted to the high-order server 300. However, the destination is not limited to the high-order server 300 and may be an arbitrary processing entity or the control apparatus 100.

(1) Static Management

When a set of pattern data collected in advance is used, first, which class each frame belongs to is decided. In each class, after a plurality of frame waveforms are collected, a waveform representing each class is selected and decided as the pattern data. A method for selecting the waveform that represents each class is accomplished by searching for a waveform that has the highest reproducibility of a result of restoring the other frame by using a waveform of any frame among a plurality of frame frames belonging to the same class. The highest reproducible waveform can be decided by searching for a waveform having the highest autocorrelation between the frame reconstruction result and the original raw data.

(2) Dynamic Management

When collecting and adding necessary pattern data in the control apparatus 100, a waveform in an abnormal state, a threshold value of the score, a threshold value to be transmitted to the high-order server 300, and the like are preset from the high-order server 300. The high-order server 300 that has received the additional pattern data from the control apparatus 100 judges whether or not to actually register the additional pattern data from the control apparatus 100 by using the algorithm as described in the static management of (1). That is, when it is judged that the reproducibility of the restored result can be improved by using the additional pattern data, the additional pattern data is registered in the high-order server 300.

Figure 7:
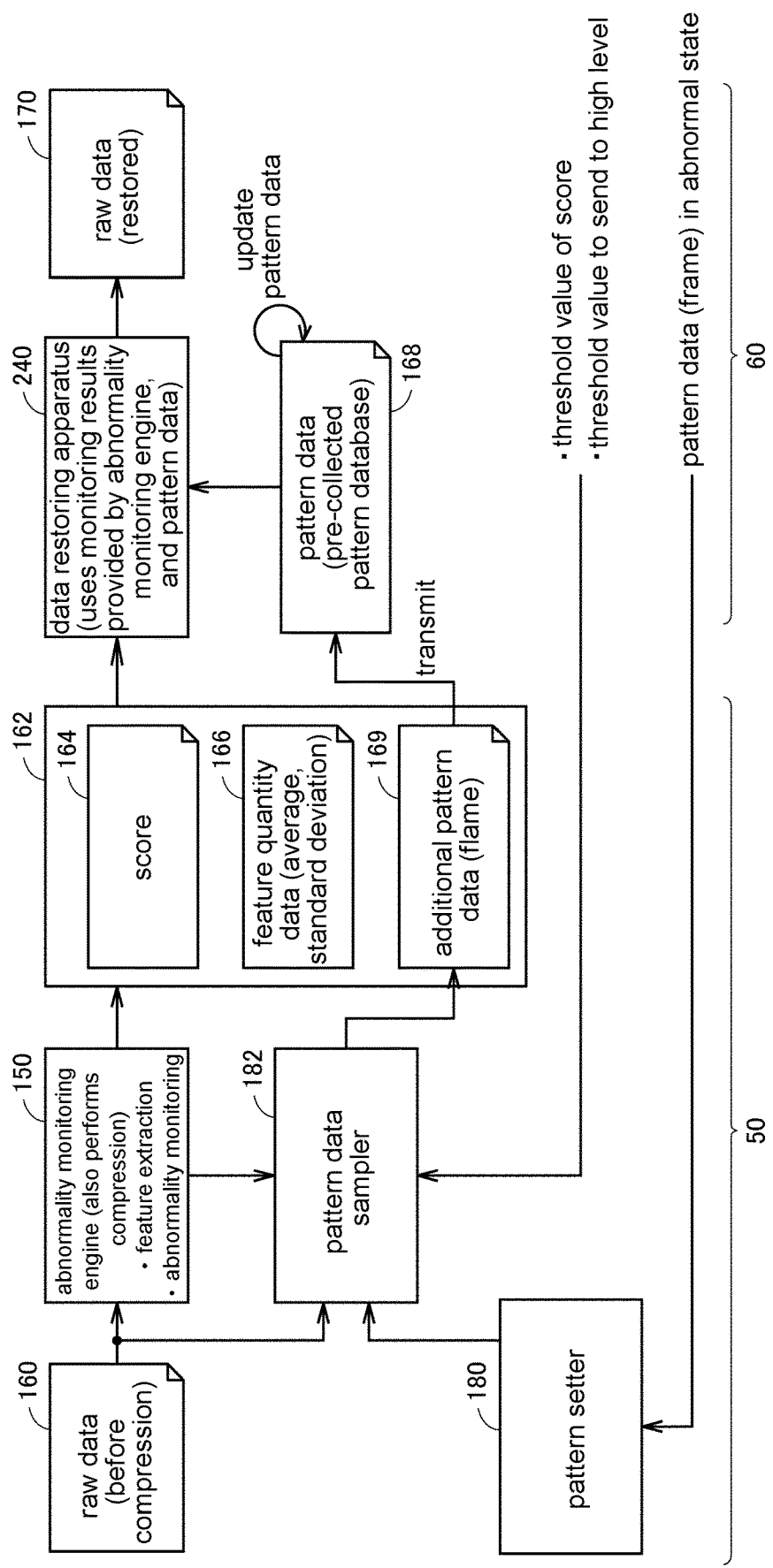
FIG. 7 is a schematic diagram showing a processing procedure that can dynamically manage pattern data related to the compression and restoration of the raw data in the abnormality monitoring system according to the embodiment.

FIG. 7 is a schematic diagram showing a processing procedure that enables the dynamic management of the pattern data related to the compression and restoration of the raw data in the abnormality monitoring system 1 according to the embodiment. In the processing procedure shown in FIG. 7, in addition to the processing procedure shown in FIG. 3, a pattern setter 180 and a pattern data sampler 182 are added. In addition, the compression result 162 further includes additional pattern data 169.

The pattern data sampler 182 extracts the waveform appearing in the raw data 160 as pattern data and outputs it as the additional pattern data 169. For the pattern data sampler 182, the waveform to be extracted by the pattern setter 180 is specified.

The pattern data sampler 182 may extract the waveform of the frame used for calculating the score 164 as the additional pattern data 169 only when the score 164 calculated by the abnormality monitoring engine 150 exceeds the predetermined threshold value. That is, the pattern data sampler 182 extracts the temporal change (raw data) in the dataset corresponding to the compression result 162 when the score 164 included in the compression result 162 indicates a predetermined value. Then, in addition to the feature quantity data 166 and the score 164, the pattern data added by the pattern data sampler 182 is output as the compression result.

For example, when the value of the score calculated for each frame is set to x, the threshold value of the score is set to y, and a condition such as score x>threshold value y or (score x/threshold value y)>1 is satisfied, the waveform of the frame may be extracted as the pattern data.

Alternatively, when a condition such as random (t)>Σ(x/y) or the like is satisfied by using a function random (t) that generates a random number of 0 to 1, the waveform of the frame may be extracted as the pattern data. By employing the above condition, the additional pattern data 169 can be extracted not only in an abnormal state but also in a normal state.

The additional pattern data 169 extracted by the processing described above is transmitted to the high-order server 300, and the high-order server 300 updates the pattern data 168 as needed.

By employing the configuration shown in FIG. 7, pattern data can be added or updated as needed for a frame having a relatively high score (that is, a frame in which some abnormality has occurred). By employing a mechanism for adding or updating the pattern data, the reproducibility of the raw data in abnormality state can be improved, or it is also possible to respond to the appearance of a new waveform at the time of abnormality.

D. PROCESSING EXAMPLE

Next, a processing example of data compression and data restoration in the abnormality monitoring system 1 according to the embodiment is described.

(d1: Compression/Restoration Processing of Raw Data in Normal State)

First, compression/restoration processing of the raw data in the normal state is described. As described above, the data amount of the original raw data can be significantly reduced (for example, 10% or less) by using the monitoring result of the abnormality monitoring processing (the compression result 162).

Figure 8:
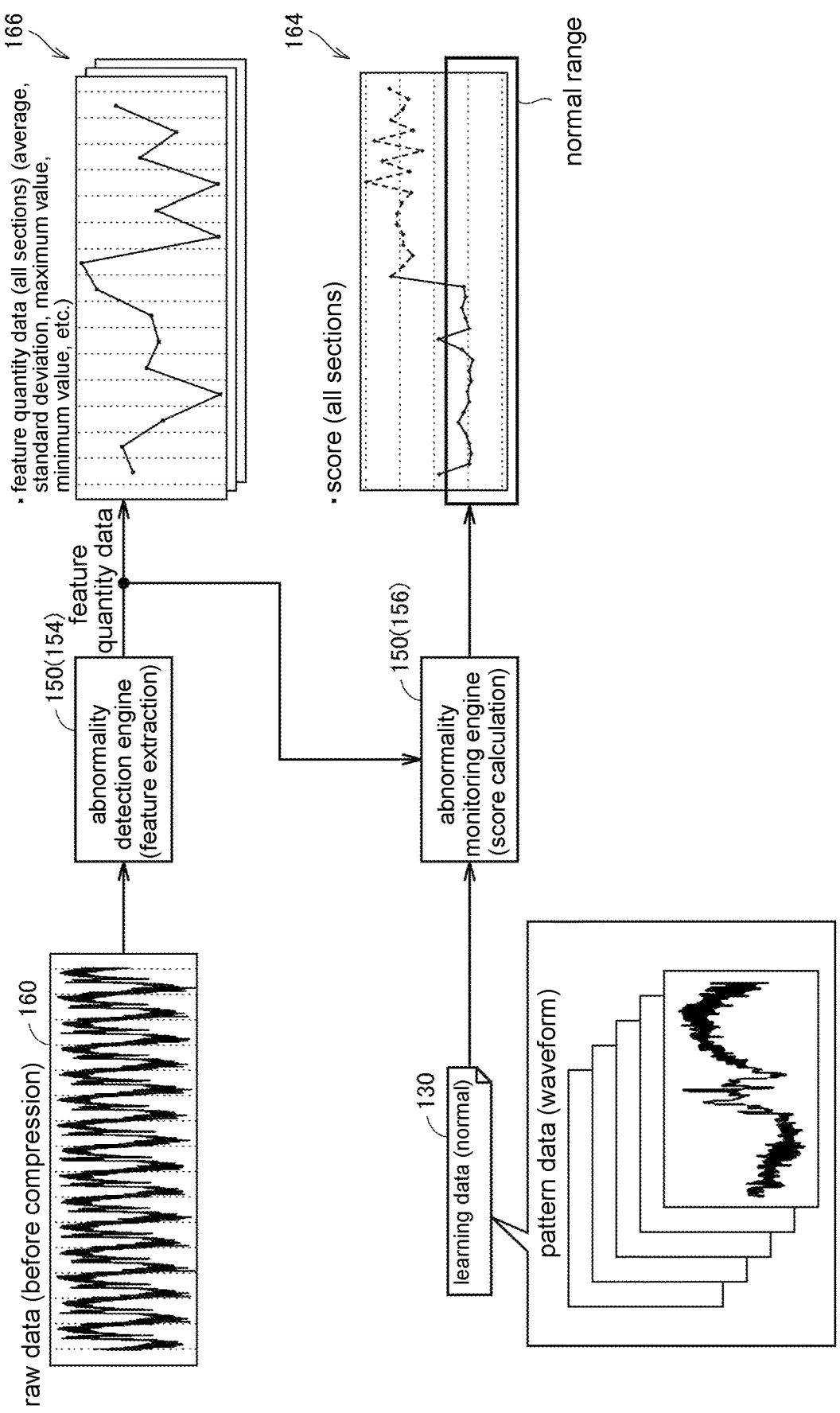
FIG. 8 is a diagram for illustrating compression processing of the raw data in a normal state in the abnormality monitoring system according to the embodiment.

FIG. 8 is a diagram for illustrating the compression processing of the raw data in the normal state in the abnormality monitoring system 1 according to the embodiment. With reference to FIG. 8, the raw data 160 is input to the abnormality monitoring engine 150, and the feature quantity data 166 is calculated. In addition, the calculated feature quantity data 166 and the learning data 130 are input to the abnormality monitoring engine 150, and the score 164 is calculated. The feature quantity data 166 and the score 164 which are calculated are stored in the internal DB 140 or the like as time series data.

In this way, the raw data 160 in the normal state (that is, a section in which the score 164 is in a normal range) is compressed using the pattern data which corresponds to the normal waveform used to generate the learning data 130. Moreover, in general abnormality monitoring processing, most sections are in the normal state, and in order to reduce network bandwidth and storage area, it is preferable that the raw data 160 in the normal state is not stored or externally output.

Next, the processing of restoring the compressed data obtained by compressing the raw data in the normal state to the raw data is described.

In the restoration processing, the raw data is restored according to the denormalization procedure on the basis of the compressed data. Because the data compression according to the embodiment is lossy compression, the restored raw data does not completely match the original raw data, but it is used to recognize the waveform in the abnormal state or to cooperate with other systems.

Figure 9:
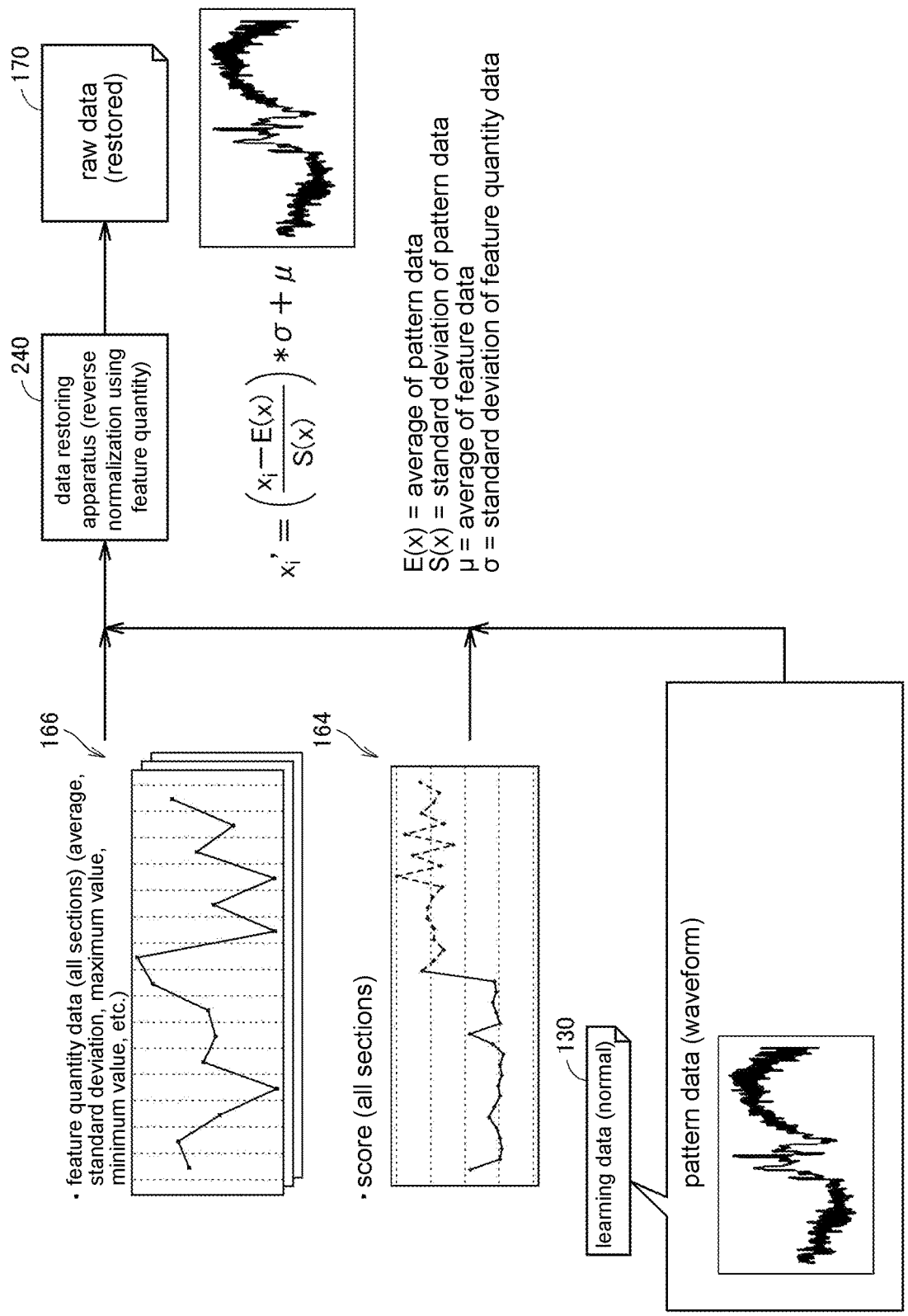
FIG. 9 is a diagram for illustrating restoration processing of the raw data in the normal state in the abnormality monitoring system according to the embodiment.

FIG. 9 is a diagram for illustrating the restoration processing of the raw data in the normal state in the abnormality monitoring system 1 according to the embodiment. With reference to FIG. 9, time series data of the score 164 and the feature quantity data 166 are input to the data restoring apparatus 240 as compressed data. The data restoring apparatus 240 restores the compressed data using the pattern data which corresponds to the normal waveform used to generate the learning data 130.

However, the original raw data 160 usually does not have the same amplitude and bias as the waveform shown by the pattern data. Therefore, by using the average and the standard deviation included in the feature quantity data 166, the compressed data is restored to the raw data after the amplitude and the bias are adjusted (reverse normalization using the feature quantity).

More specifically, a displacement $x_i'$ of a position i of the restored raw data 170 is calculated by the reverse normalization shown below using a displacement $x_i$ of the corresponding position i of the pattern data, an average $E(x)$ of the pattern data, a standard deviation $S(x)$ of the pattern data, an average $\mu$ of the feature quantity data 166, and a standard deviation $\sigma$ of the feature quantity data 166.

$$x_i'=(x_i-E(x)/S(x))\times\sigma+\mu$$

Thus, the feature quantity data 166 includes the average $\mu$ and the standard deviation $\sigma$ of the dataset (raw data for each frame), and the data restoring apparatus 240 restores the temporal change in a target dataset by denormalizing the corresponding pattern data on the basis of the average $\mu$ and the standard deviation $\sigma$ of the dataset (raw data for each frame).

Moreover, when a plurality of pattern data are registered, the pattern data having the highest autocorrelation may be selected and used to restore to the raw data.

In this way, the data restoring apparatus 240 selects pattern data corresponding to a class determined according to the score 164 included in the compression results by referring to pattern data for each class prepared in advance, and after adjusting the pattern data using the feature quantity data 166 contained in the compression results, restores the pattern data as a temporal change in the dataset corresponding to the monitoring result (the compression result 162).

The raw data 160 in the normal state can be efficiently compressed and restored by the compression processing and the restoration processing described above.

(d2: Compression/Restoration Processing of Raw Data in Abnormal State)

Next, compression/restoration processing of raw data in an abnormal state is described. The raw data in the abnormal state is useful for purposes such as cause analysis and predictive analysis of abnormalities. Therefore, the compression and restoration can be performed more precisely by judging whether or not the waveform appearing in the generated abnormality is the same as the pattern data (waveform) at the time of known abnormality has occurred, and extracting the waveform as the additional pattern data as necessary.

Figure 10:
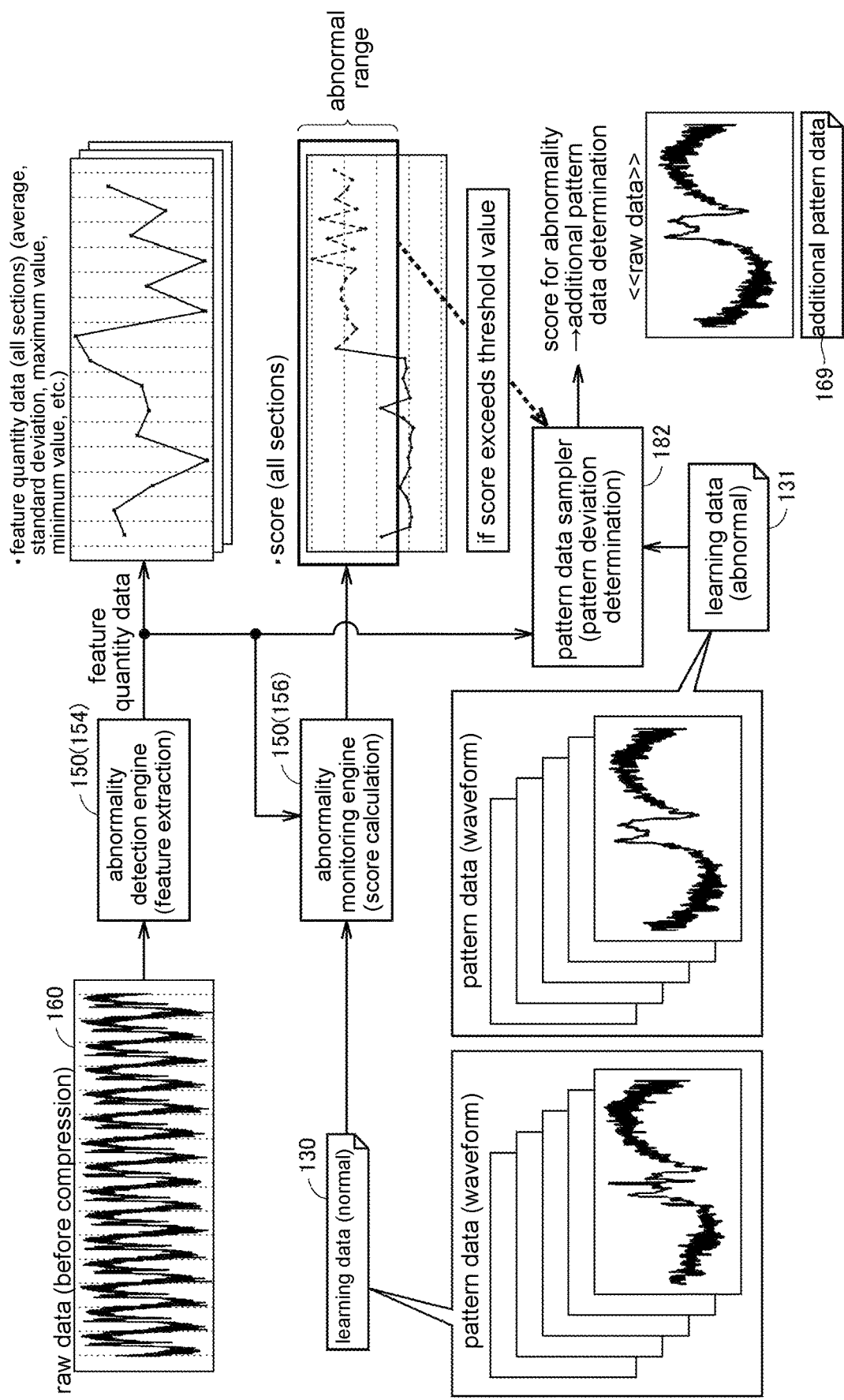
FIG. 10 is a diagram for illustrating compression processing of the raw data in an abnormal state in the abnormality monitoring system according to the embodiment.

FIG. 10 is a diagram for illustrating the compression processing of the raw data in the abnormal state in the abnormality monitoring system 1 according to the embodiment. With reference to FIG. 10, the raw data 160 is input to the abnormality monitoring engine 150, and the feature quantity data 166 is calculated. In addition, the calculated feature quantity data 166 is input to the abnormality monitoring engine 150 together with the learning data 130 (normal) generated from the waveform in the normal state, and the score 164 is calculated. The calculated feature quantity data 166 and the score 164 are stored in the internal DB 140 or the like as time series data.

Furthermore, when the calculated score 164 exceeds the threshold value, the pattern data sampler 182 judges the degree of deviation from the known pattern data (the learning data 131 (abnormal) generated from the waveform in the abnormal state). Then, the waveform having a large degree of deviation from the known pattern data is extracted as the additional pattern data 169. That is, when the degree of deviation of the temporal change in the dataset extracted from the pattern data prepared in advance exceeds the predetermined value, the pattern data sampler 182 adds the temporal change in the extracted dataset as the pattern data referred to by the data restoring apparatus 240. Moreover, the extracted additional pattern data 169 may be transmitted to the high-order server 300 or stored in the control apparatus 100 as necessary.

In this way, the raw data 160 in abnormal state (that is, the section in which the score 164 is in an abnormal range) is compressed using the pattern data corresponding to the abnormal waveform used to generate the learning data 131. Alternatively, the raw data 160 in abnormal state is compressed using the additional pattern data 169 extracted during the abnormality monitoring processing.

Next, the processing of restoring the compressed data obtained by compressing the raw data in the abnormal state to the raw data is described.

Similar to the restoration processing of the raw data in the normal state, the raw data is restored according to the denormalization procedure using the pattern data on the basis of the compressed data. The pattern data used for restoration may be known pattern data, or pattern data (the additional pattern data 169) corresponding to a new waveform at the time of abnormality.

Figure 11:
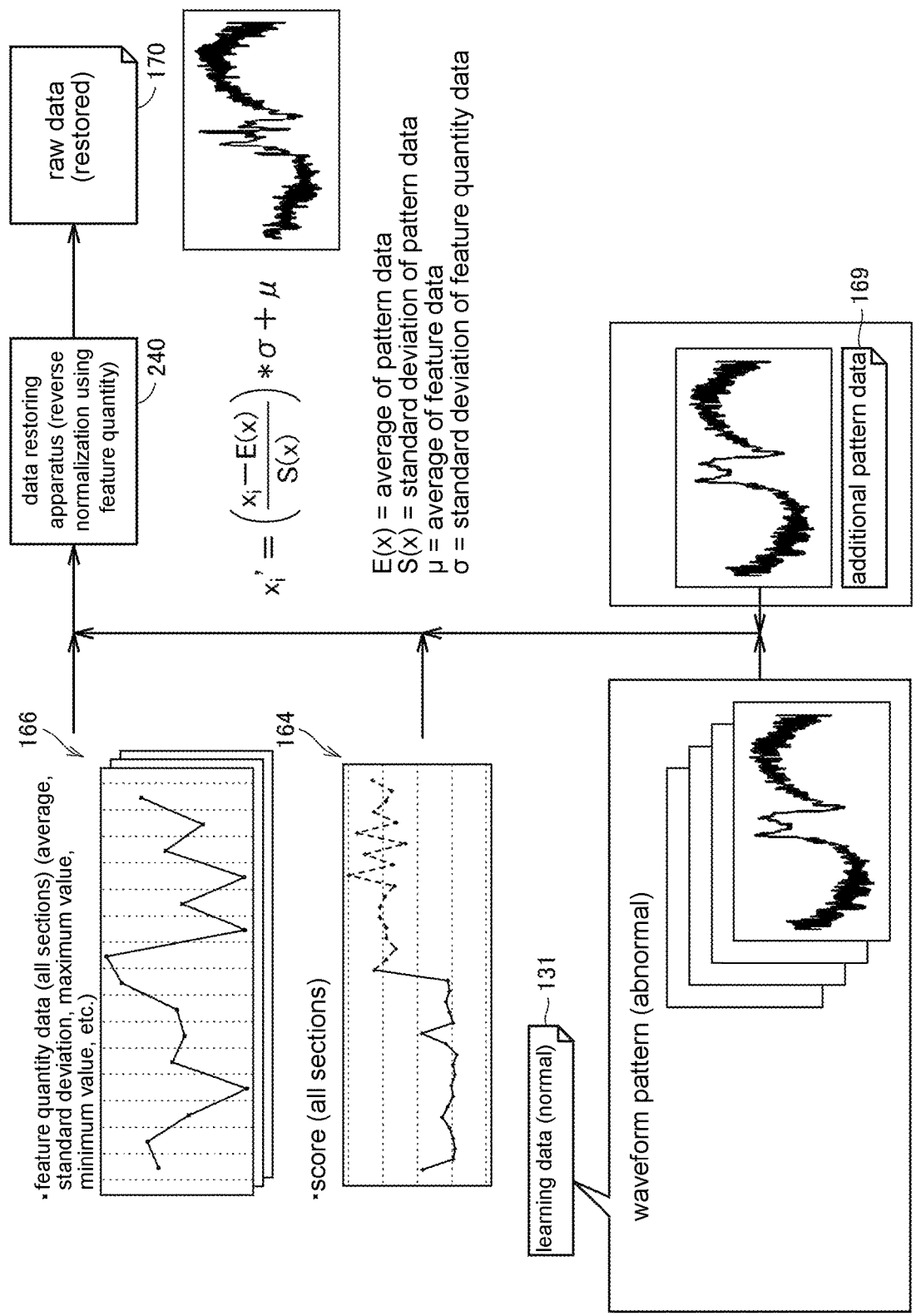
FIG. 11 is a diagram for illustrating restoration processing of the raw data in the abnormal state in the abnormality monitoring system according to the embodiment.

FIG. 11 is a diagram for illustrating the restoration processing of the raw data in the abnormal state in the abnormality monitoring system 1 according to the embodiment. With reference to FIG. 11, time series data of the score 164 and the feature quantity data 166 are input to the data restoring apparatus 240 as compressed data. The data restoring apparatus 240 restores the compressed data to the raw data using the pattern data included in the learning data 131 which is generated from the waveform in the abnormal state. A specific section may also be restored using the additional pattern data 169 as necessary.

In this way, the data restoring apparatus 240 restores the temporal change (raw data) of the dataset by referring to the additional pattern data 169 added by the pattern data sampler 182 in addition to the pattern data prepared in advance.

At this time, similar to the restoration processing of the raw data in the normal state, by using the average and standard deviation included in the feature quantity data 166, the compressed data is restored to the raw data after the amplitude and the bias are adjusted (reverse normalization using the feature quantity). Because the specific procedure is the same as that of the restoration processing of the raw data in the normal state shown in FIG. 9, the detailed description is not repeated.

In this way, the data restoring apparatus 240 selects pattern data corresponding to a class determined according to the score 164 included in the compression results by referring to pattern data for each class prepared in advance, and after adjusting the pattern data using the feature quantity data 166 contained in the compression results, restores the pattern data as a temporal change in the dataset corresponding to the compression result 162 (monitoring result).

The raw data 160 in the abnormal state can be efficiently compressed and restored by the compression processing and restoration processing described above.

(d3: Display Example)

Next, the advantages of using the raw data storage function in the abnormality monitoring processing according to the embodiment is described.

Figure 12:
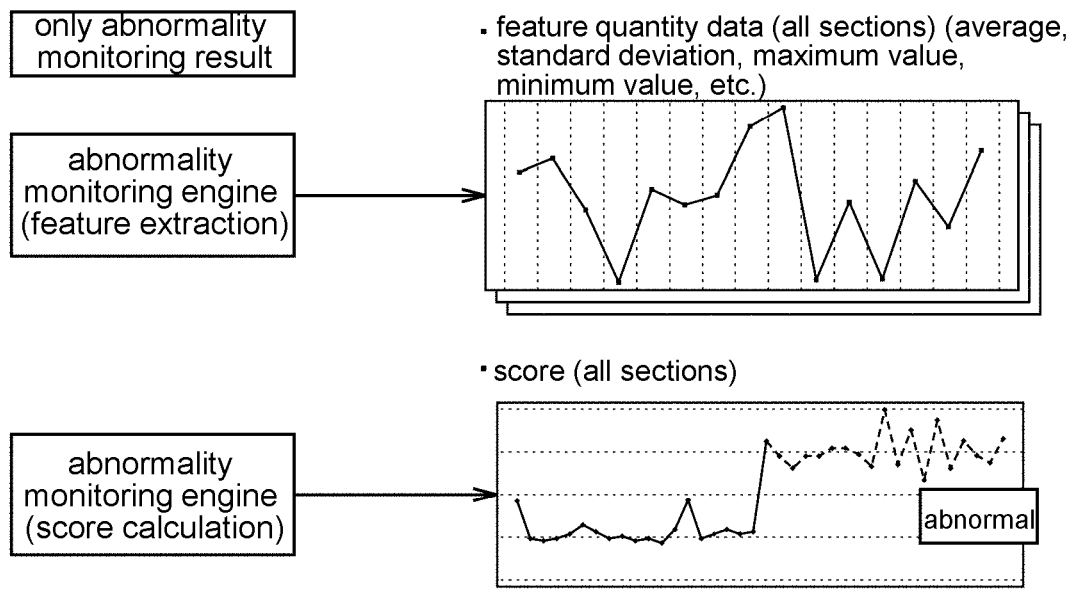
FIG. 12 is a schematic diagram showing a display example in which only monitoring results of the abnormality monitoring processing according to the embodiment are displayed.
Figure 13:
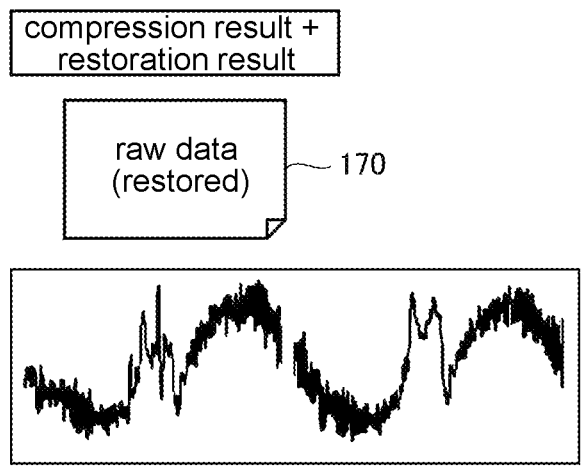
FIG. 13 is a schematic diagram showing a display example in which restored raw data in the abnormality monitoring processing according to the embodiment is displayed.

FIG. 12 is a schematic diagram showing a display example in which only the monitoring results in the abnormality monitoring processing according to the embodiment are displayed. FIG. 13 is a schematic diagram showing a display example in which the restored raw data in the abnormality monitoring processing according to the embodiment is displayed.

With reference to FIG. 12, in the abnormality monitoring processing according to the embodiment, the presence or absence of an abnormality is monitored by using the feature quantity data 166 calculated from the input data and the score 164 calculated from the feature quantity data 166. On the other hand, it is not easy to estimate the cause of the abnormality and what happens when the abnormality occurs by displaying only these data.

In contrast, by displaying the above data together with the restored raw data as shown in FIG. 13, it is possible to grasp at a glance what happens when an abnormality occurs. Furthermore, it is possible to confirm the true cause of the abnormality that has occurred by comparing it with past results.

When some abnormality occurs, by restoring and displaying not only the information (the feature quantity and the score) used to judge the abnormality, but also the raw data (waveform) when the abnormality occurs, the user can easily understand or estimate the actual state of the object to be controlled.

E. PROCESSING PROCEDURE

Next, processing related to compression and restoration of the raw data using the abnormality monitoring processing according to the embodiment is described.

(e1: Compression Processing)

Figure 14:
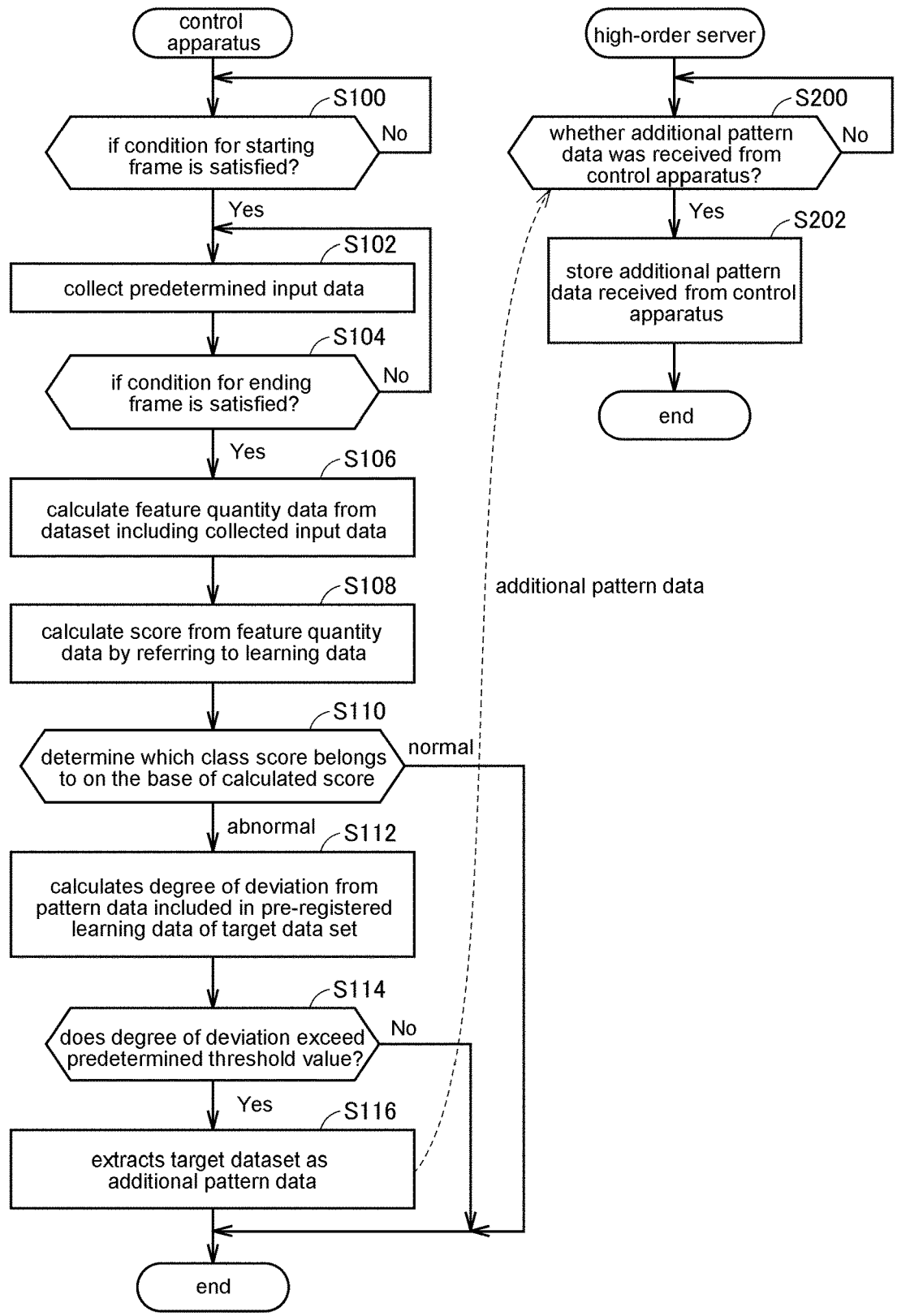
FIG. 14 is a flowchart showing a processing procedure of the compression processing of the raw data using the abnormality monitoring processing according to the embodiment.

FIG. 14 is a flowchart showing a processing procedure of the compression processing of the raw data using the abnormality monitoring processing according to the embodiment. FIG. 14 shows an example in which processing is executed by the control apparatus 100 and the high-order server 300, respectively. Typically, each step of the control apparatus 100 is accomplished in a manner of executing the system program 126 by the processor 102 of the control apparatus 100, and similarly, each step of the high-order server 300 is accomplished in a manner of executing a required program by the processor of the high-order server 300.

With reference to FIG. 14, the control apparatus 100 determines whether or not the condition for starting the frame is satisfied (step S100). If the condition for starting the frame is not satisfied (NO in step S100), the processing of step S100 is repeated.

If the condition for starting the frame is satisfied (YES in step S100), the control apparatus 100 collects the predetermined input data (step S102).

Subsequently, the control apparatus 100 determines whether or not the condition for ending the frame is satisfied (step S104). If the condition for ending the frame is not satisfied (NO in step S104), the processing of step S102 and after this is repeated.

If the condition for ending the frame is satisfied (YES in step S104), the control apparatus 100 calculates the feature quantity data 166 from the dataset including the input data collected in step S102 (step S106). Then, the control apparatus 100 calculates the score from the feature quantity data 166 by referring to the learning data 130 (step S108).

The control apparatus 100 decides which class the score belongs to on the basis of the calculated score (step S110). Typically, whether the object to be monitored is normal or whether some abnormality has occurred is determined.

When it is determined that the calculated score belongs to the abnormal class ("abnormal" in step S100), the control apparatus 100 calculates the degree of deviation from the pattern data included in the pre-registered learning data 131 of the target data set (step S112). Then, the control apparatus 100 determines whether or not the calculated degree of deviation exceeds the predetermined threshold value (step S114).

If the calculated degree of deviation exceeds the predetermined threshold value (YES in step S114), the control apparatus 100 extracts the target dataset as the additional pattern data 169 (step S116). The control apparatus 100 stores the extracted additional pattern data 169 in its own apparatus, or transmits it to the high-order server 300.

If the calculated degree of deviation does not exceed the predetermined threshold value (NO in step S114), the processing of step S116 is skipped.

On the other hand, when it is determined that the calculated score belongs to the normal class ("normal" in step S100), the processing of steps S112 to S116 is skipped.

When the above series of processing is completed, the processing of step S100 and after this is repeated.

In addition, the high-order server 300 determines whether or not the additional pattern data 169 has been received from the control apparatus 100 (step S200). If the additional pattern data 169 is not received from the control apparatus 100 (NO in step S200), the processing of step S200 is repeated.

If the additional pattern data 169 is received from the control apparatus 100 (YES in step S200), the high-order server 300 stores the additional pattern data 169 received from the control apparatus 100 (step S202).

When the above series of processing is completed, the processing of step S200 and after this is repeated.

(e2: Restoration Processing)

Figure 15:
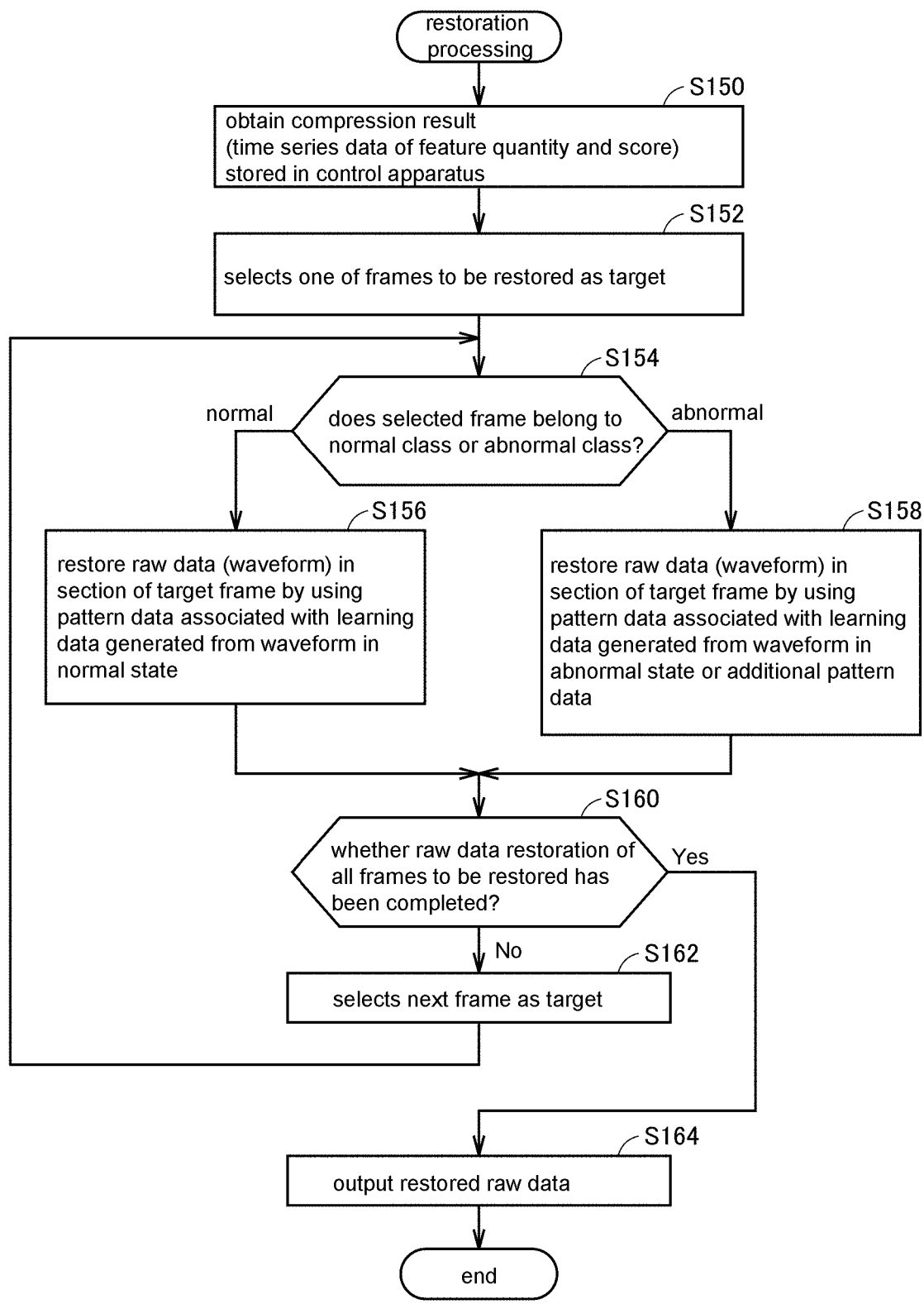
FIG. 15 is a flowchart showing a processing procedure of the restoration processing of the raw data using the abnormality monitoring processing according to the embodiment.

FIG. 15 is a flowchart showing a processing procedure of the restoration processing of the raw data using the abnormality monitoring processing according to the embodiment. FIG. 15 shows an example in which the restoration processing is executed in the high-order server 300. Typically, each step of the high-order server 300 is accomplished in a manner of executing required program by the processor of the high-order server 300.

With reference to FIG. 15, the high-order server 300 acquires the compression result (time series data of the feature quantity and the score) stored in the control apparatus 100 by the satisfaction of a request from the user or a predetermined condition (step S150).

Then, the high-order server 300 selects one of the frames to be restored as a target (step S152), and determines whether this frame selected as the target belongs to the normal class or abnormal class on the basis of the score of this frame selected as the target (step S154).

When it is determined that the frame selected as the target belongs to the normal class ("normal" in step S154), the high-order server 300 restores the raw data (waveform) in the section of the target frame by using the pattern data associated with the learning data 130 generated from the waveform in the normal state (step S156).

On the other hand, when it is determined that the frame selected as the target belongs to the abnormal class ("abnormal" in step S154), the high-order server 300 restores the raw data (waveform) in the section of the target frame by using the pattern data associated with the learning data 130 generated from the waveform in the abnormal state or the additional pattern data 169 (step S158).

Then, the high-order server 300 determines whether or not the restoration of the raw data of all the frames to be restored is completed (step S160). If the restoration of the raw data of the frames to be restored is not completed (NO in step S160), the high-order server 300 selects the next frame as the target (step S162), and repeats the processing of step S154 and after this.

If the restoration of the raw data of all the frames to be restored is completed (YES in step S160), the high-order server 300 outputs the restored raw data (step S164). Then, the data restoration processing is completed.

F. VARIATION EXAMPLE

Hereinafter, some variation examples are described.

(f1: Restoration Processing Executed by Control Apparatus 100)

In the above description, a configuration example is described in which a processing entity other than the control apparatus 100 (the high-order server 300, the HMI 400, the support apparatus 200, and the like) has the data restoring apparatus 240, but the present invention is not limited thereto, and the data restoring apparatus 240 may be arranged in the control apparatus 100. By arranging the data restoring apparatus 240 in the control apparatus 100, the restored raw data can be used, and various data can thus be utilized.

Figure 16:
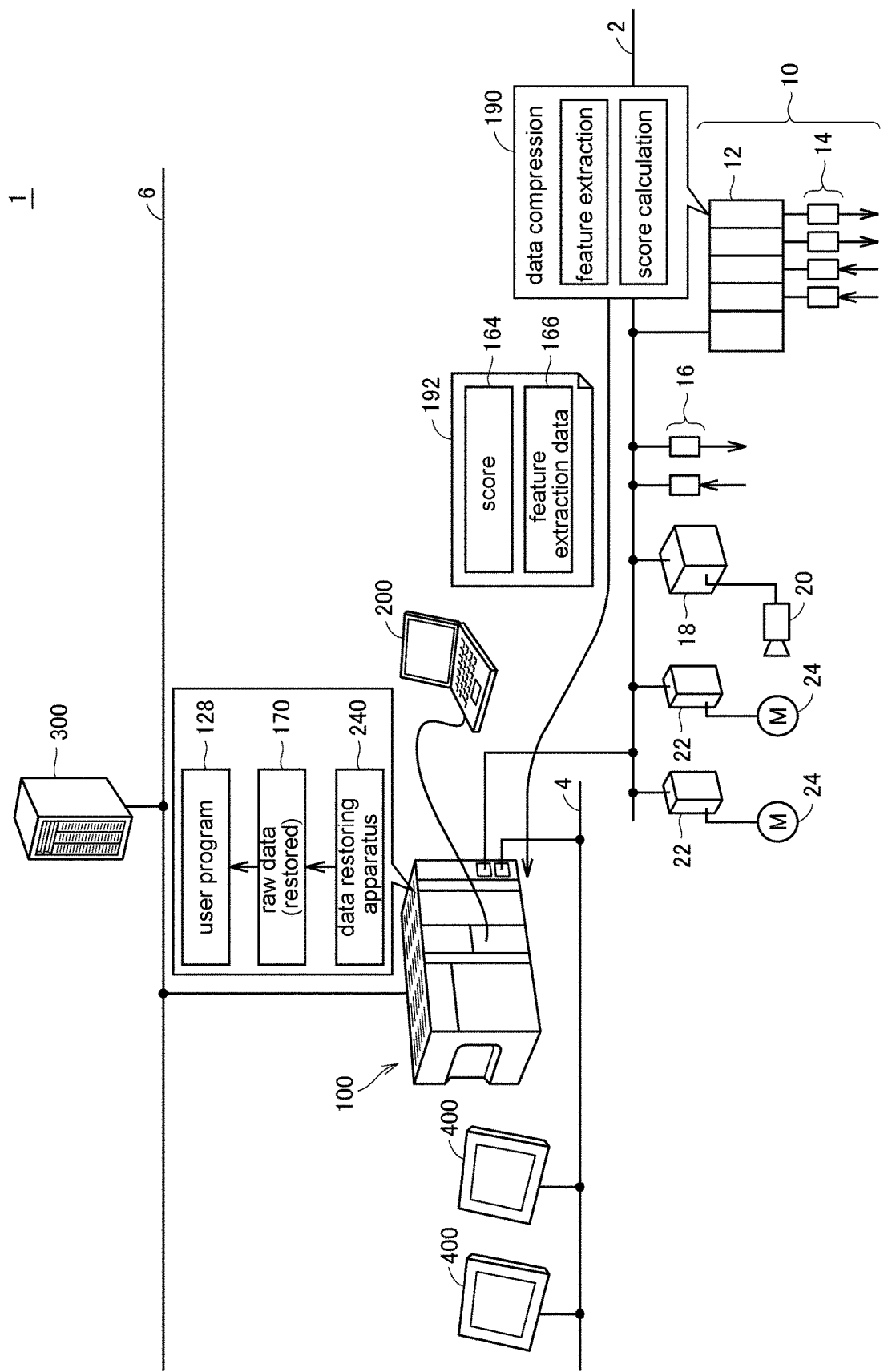
FIG. 16 is a schematic diagram showing an overall configuration example of an abnormality monitoring system according to a variation example of the embodiment.

FIG. 16 is a schematic diagram showing an overall configuration example of the abnormality monitoring system 1 according to a variation example of the embodiment. In the abnormality monitoring system 1 shown in FIG. 16, the raw data can be compressed on the field side and restored by the control apparatus 100. Accordingly, the control apparatus 100 can utilize the restored raw data.

More specifically, with reference to FIG. 16, the remote I/O apparatus 12 has a data compression unit 190. The data compression unit 190 executes processing of feature extraction and score calculation for the input data (raw data) acquired from the field. The data compression unit 190 generates a compression result 192 including the score 164 and the feature quantity data 166, and transmits the compression result 192 to the control apparatus 100.

Moreover, the implementation of the data compression unit 190 on the field side may be accomplished not only by using a processor but also by using a device such as a FPGA that can speed up processing. By employing this device, a real-time property of program can be ensured.

The control apparatus 100 has the data restoring apparatus 240, and the data restoring apparatus 240 restores the compression result 192 to the raw data 170. Accordingly, the restored raw data 170 can be accessed in the control apparatus 100. Typically, a user program 128 executed on the control apparatus 100 can utilize the restored raw data 170.

For example, the user program 128 calculates the time required for the rise of the waveform in the frame on the basis of the restored raw data 170. When the calculated time is suddenly below the predetermined threshold value, the user program 128 can realize processing such as controlling an arbitrary actuator and correcting at an appropriate time.

In this way, in the abnormality monitoring system 1 shown in FIG. 16, the control apparatus 100 can restore the compression result to the raw data 170, and thus valid information can be referred to from the user program 128 or the like.

Furthermore, in the abnormality monitoring system 1 shown in FIG. 16, it is effective even when there is a restriction on the amount of data transferred between an arbitrary device connected via the fieldbus and the control apparatus 100. For example, it is effective when the sampling cycle in the device is short or when there is a large amount of information to be transmitted.

In the abnormality monitoring system 1 shown in FIG. 16, information when an abnormality occurs on the field side can be stored on the control apparatus 100 side. By storing such information, traceable data management can be accomplished.

In addition, special processing at the time of abnormality, a self-diagnosis function, and the like can be easily accomplished by including processing of triggering the data of a specific frame in which some abnormality has occurred into the user program 128.

(f2: Restoration Processing Executed by Support Apparatus 200)

In the control apparatus 100, it is possible to execute control on the basis of the feature quantity data calculated from the input data, but it is difficult to debug the user program 128 that executes the control. Therefore, in the support apparatus 200, the efficiency of debugging can be improved by restoring to the raw data and referring to the restored raw data.

That is, the user program 128 executes processing on the basis of the feature quantity data, and facilitates confirmation of its validity by making it possible to confirm the raw data and the like restored at the time of online debugging or the like by using the support apparatus 200.

Figure 17:
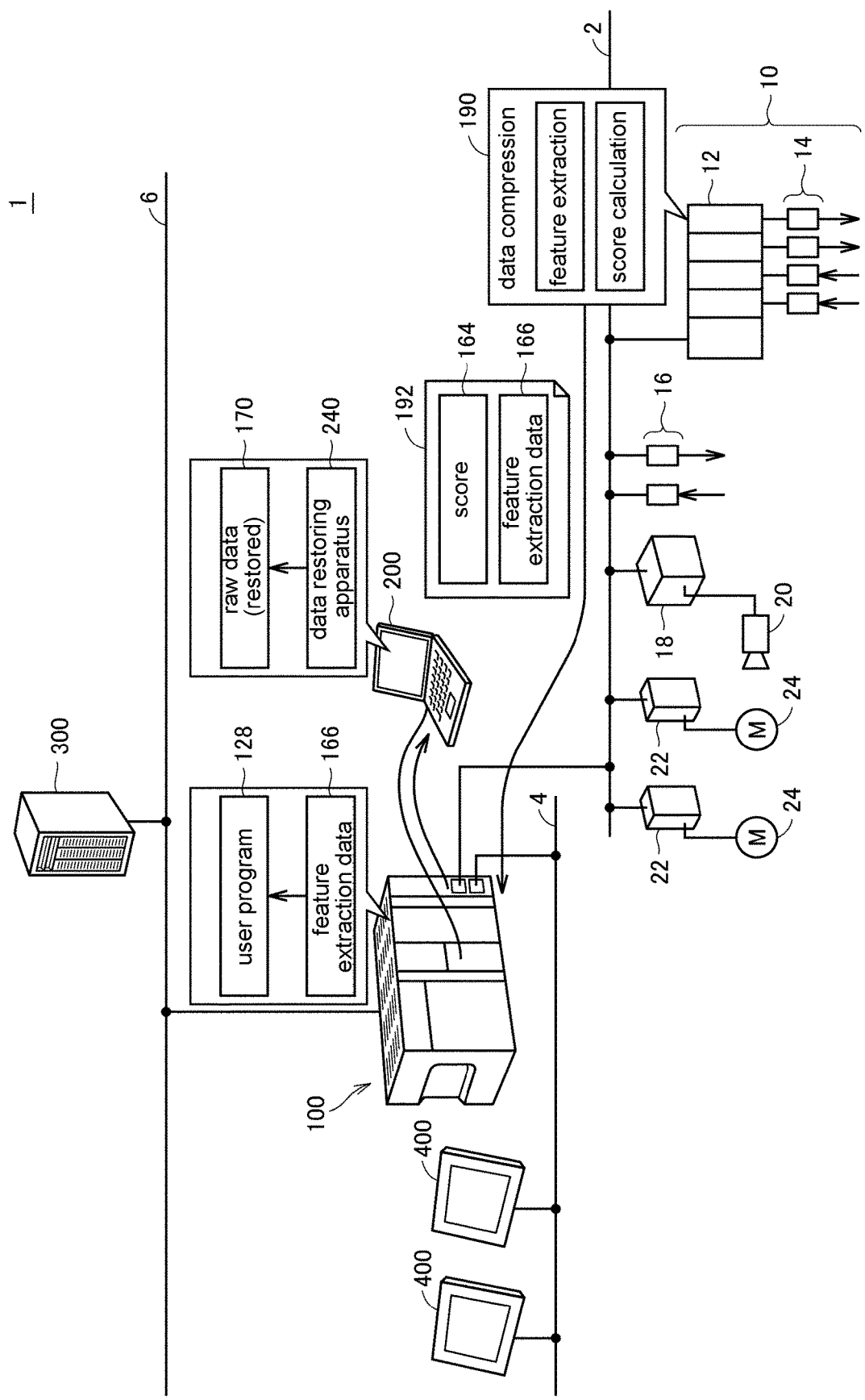
FIG. 17 is a schematic diagram showing an overall configuration example of an abnormality monitoring system according to another variation example of the embodiment.

FIG. 17 is a schematic diagram showing an overall configuration example of the abnormality monitoring system 1 according to another variation example of the embodiment. In the abnormality monitoring system 1 shown in FIG. 17, the raw data can be compressed on the field side and restored by the support apparatus 200. Accordingly, the raw data restored on the support apparatus 200 side can be utilized.

More specifically, with reference to FIG. 17, the remote I/O apparatus 12 has the data compression unit 190. The data compression unit 190 executes the processing of feature extraction and score calculation for the input data (raw data) acquired from the field. The data compression unit 190 generates the compression result 192 including the score 164 and the feature quantity data 166, and transmits the compression result 192 to the control apparatus 100.

Moreover, the implementation of the data compression unit 190 on the field side may be accomplished not only by using the processor but also by using a device such as an FPGA that can speed up processing. By employing such a device, the real-time property of program can be ensured.

The user program 128 executed by the control apparatus 100 executes processing on the basis of the feature quantity data 166 included in the compression result 192.

In addition, the compression result 192 is transferred to the support apparatus 200, or the support apparatus 200 can refer to the compression result 192 held by the control apparatus 100. The support apparatus 200 has the data restoring apparatus 240, and the data restoring apparatus 240 restores the compression result 192 to the raw data 170. Accordingly, the restored raw data 170 can be referred to in the support apparatus 200. Typically, in a situation in which the user program 128 executed by the control apparatus 100 is debugged on the support apparatus 200, the restored raw data 170 can be referred to, and the efficiency of debugging can be improved.

In this way, in the user program 128 which executes processing using the feature quantity data, only the user program 128 can be debugged, and integrated debugging for confirming consistency with the raw data or the like cannot be performed. In contrast, by implementing the data restoring apparatus 240 in the support apparatus 200, the restored raw data can be confirmed and recorded, and whether the behavior of the user program 128 with respect to the raw data is appropriate can be easily to confirmed.

For example, a variance of the feature quantity data 166 can be used to create the user program 128 that monitors variations. In this case, as for the user program 128 that requires the variance, operation can be confirmed as a unit test, but whether the determination is made correctly for the actual data is difficult to confirm. With respect to this problem, conventionally, debugging using the data trace function equipped on the control apparatus 100, a method of connecting a measuring instrument to an actual sensor or the like to check, and the like are assumed. However, the former cannot support data compression in a device on a fieldbus, and the latter is troublesome.

By employing the above-mentioned method for the above problem, debugging becomes easier.

G. APPENDIX

The embodiment described above includes the following technical ideas.

[Configuration 1]

A control system including: a generator (152) that generates a dataset including temporal changes in one or more input values for each unit section;

a feature extraction unit (154) that generates feature quantity data (166) on the basis of the dataset;

a score calculation unit (156) that calculates a score (164) indicating a degree of deviation of the feature quantity data from learning data (130), by referring to the learning data (130) including feature quantity data labeled with a specific class, wherein the feature quantity data (166) and the score (164) are output as compression results (162) of the dataset;

and a restoration unit (240) that selects pattern data corresponding to a class decided according to the score contained in the compression result by referring to pattern data (168) for each class prepared in advance, and after adjusting the pattern data using the feature quantity data contained in the compression results, restores the pattern data as a temporal change (170) in the dataset corresponding to the compression results.

[Configuration 2]

The control system according to configuration 1, wherein a plurality of the compression results are continuously output, and the restoration unit continuously restores the temporal change in the dataset from each of the compression results.

[Configuration 3]

The control system according to configuration 1 or 2, wherein the feature quantity data includes an average (1661) and a standard deviation (1662) of the dataset, and the restoration unit restores the temporal change in the dataset by denormalizing the corresponding pattern data on the basis of the average and the standard deviation of the dataset.

[Configuration 4]

The control system according to any one of configurations 1 to 3, further including a sampling unit (182) that extracts a temporal change in a dataset corresponding to a compression result when the score included in the compression result exceeds a predetermined value.

[Configuration 5]

The control system according to configuration 4, wherein when the degree of deviation of the temporal change in the extracted dataset from the pattern data prepared in advance exceeds a predetermined value, the sampling unit adds the temporal change in the extracted dataset as the pattern data (169) referred to by the restoration unit.

[Configuration 6]

The control system according to configuration 5, wherein in addition to the feature quantity data and the score, the pattern data (169) added by the sampling unit is output as the compression result.

[Configuration 7]

The control system according to configuration 5 or 6, wherein the restoration unit restores the temporal change in the dataset by referring to the pattern data (169) added by the sampling unit in addition to the pattern data prepared in advance.

[Configuration 8]

The control system according to any one of configurations 1 to 7, further including a judgment unit (158) that judges, on the basis of the score, whether or not an abnormality has occurred in the object to be monitored related to the one or more input values.

[Configuration 9]

The control system according to any one of configurations 1 to 8, including: a control apparatus (100) that controls an object to be controlled; and external apparatuses (200, 300, 400) capable of communicating with the control apparatus,
wherein
the generation unit (152), the feature extraction unit (154), and the score calculation unit (156) are arranged in the control apparatus, and
the restoration unit (240) is arranged in the external apparatus.

[Configuration 10]

A control method executed in a control system (1) including a control apparatus (100) for controlling an object to be controlled, including:
steps (S100, S102, S104) of generating a dataset including temporal changes in one or more input values for each unit section;
a step (S106) of generating feature quantity data (166) on the basis of the dataset;
a step (S108) of calculating a score indicating a degree of deviation of the feature quantity data from learning data, by referring to the learning data (130) including feature quantity data labeled with a specific class, wherein the feature quantity data (166) and the score (164) are output as compression results (162) of a dataset; and
steps (S152, S154, S156, S158, S160) of selecting pattern data (168) corresponding to a class determined according to the score contained in the compression result by referring to pattern data for each class prepared in advance, and after adjusting the pattern data using the feature quantity data contained in the compression results, restoring the pattern data as a temporal change (170) in the dataset corresponding to the compression results.

H. ADVANTAGES

In the abnormality monitoring system according to the embodiment, the abnormality monitoring processing can be used to store the raw data after compressing the raw data. In addition, the compressed raw data can be appropriately restored using the pattern data. In this way, the abnormality monitoring processing and the compression and restoration processing of the data can be executed as common processing, and thus an increase in processing load related to data storage can be prevented and efficient storage of the raw data can be accomplished.

The embodiment disclosed this time should be considered illustrative in all respects and not restrictive. The scope of the present invention is indicated by the claims rather than by the foregoing description, and meanings equivalent to the claims and all modifications within the scope are intended to be included herein.

What is claimed is:

1. A control system comprising: a generation unit that generates a dataset comprising temporal changes in one or more input values for each unit section;
a feature extraction unit that generates feature quantity data on the basis of the dataset;
a score calculation unit that calculates a score indicating a degree of deviation of the feature quantity data from learning data, by referring to the learning data comprising feature quantity data labeled with a specific class, wherein the feature quantity data and the score are output as compression results of the dataset; and
a restoration unit that selects pattern data corresponding to a class determined according to the score contained in the compression results by referring to pattern data for each class prepared in advance, and after adjusting the pattern data using the feature quantity data contained in the compression results, restores the pattern data as a temporal change in the dataset corresponding to the compression results.

2. The control system according to claim 1, wherein a plurality of the compression results are continuously output, and
the restoration unit continuously restores the temporal change in the dataset from each of the compression results.

3. The control system according to claim 1, wherein the feature quantity data comprises an average and a standard deviation of the dataset, and
the restoration unit restores the temporal change in the dataset by denormalizing the corresponding pattern data on the basis of the average and the standard deviation of the dataset.

4. The control system according to claim 1, further comprising a sampling unit that extracts a temporal change in a dataset corresponding to the compression result when the score comprised in the compression result exceeds a predetermined value.

5. The control system according to claim 4, wherein when the degree of deviation of the temporal change in the extracted dataset from the pattern data prepared in advance exceeds a predetermined value, the sampling unit adds the temporal change in the extracted dataset as the pattern data referred to by the restoration unit.

6. The control system according to claim 5, wherein in addition to the feature quantity data and the score, the pattern data added by the sampling unit is output as the compression result.

7. The control system according to claim 5, wherein the restoration unit restores the temporal change in the dataset by referring to the pattern data added by the sampling unit in addition to the pattern data prepared in advance.

8. The control system according to claim 1, further comprising a judgment unit that judges, on the basis of the score, whether or not an abnormality has occurred in an object to be monitored related to the one or more input values.

9. The control system according to claim 1, comprising:
a control apparatus that controls an object to be controlled; and
external apparatuses capable of communicating with the control apparatus, wherein
the generation unit, the feature extraction unit, and the score calculation unit are arranged in the control apparatus, and
the restoration unit is arranged in the external apparatus.

10. A control method executed in a control system comprising a control apparatus for controlling an object to be controlled, comprising:
a step of generating a dataset comprising temporal changes in one or more input values for each unit section;
a step of generating feature quantity data on the basis of the dataset;
a step of calculating a score indicating a degree of deviation of the feature quantity data from learning data, by referring to the learning data comprising feature quantity data labeled with a specific class, wherein the feature quantity data and the score are output as compression results of the dataset; and
a step of selecting pattern data corresponding to a class determined according to the score contained in the compression result by referring to pattern data for each class prepared in advance, and after adjusting the pattern data using the feature quantity data contained in the compression results, restoring the pattern data as a temporal change in the dataset corresponding to the compression results.

* * * * *